United States Patent
Kuroda

(10) Patent No.: US 9,978,717 B2
(45) Date of Patent: May 22, 2018

(54) MULTILAYER SEMICONDUCTOR INTEGRATED CIRCUIT DEVICE

(71) Applicant: THRUCHIP JAPAN INC., Tokyo (JP)

(72) Inventor: Tadahiro Kuroda, Yokohama (JP)

(73) Assignee: THRUCHIP JAPAN INC., Tokyo (JP)

( * ) Notice: Subject to any disclaimer, the term of this patent is extended or adjusted under 35 U.S.C. 154(b) by 0 days. days.

(21) Appl. No.: 15/261,402

(22) Filed: Sep. 9, 2016

(65) Prior Publication Data

US 2016/0379958 A1    Dec. 29, 2016

Related U.S. Application Data

(63) Continuation of application No. PCT/JP2014/084492, filed on Dec. 26, 2014.

(30) Foreign Application Priority Data

Mar. 12, 2014 (JP) ................. 2014-049357

(51) Int. Cl.
*H01L 23/48* (2006.01)
*H01L 25/065* (2006.01)
(Continued)

(52) U.S. Cl.
CPC ........ *H01L 25/0652* (2013.01); *H01L 21/486* (2013.01); *H01L 21/6835* (2013.01);
(Continued)

(58) Field of Classification Search
CPC ............... H01L 21/486; H01L 21/6835; H01L 21/76898; H01L 23/481; H01L 23/5383;
(Continued)

(56) References Cited

U.S. PATENT DOCUMENTS

2003/0127724 A1   7/2003  Senba
2007/0108551 A1*  5/2007  Lin ..................... H01L 23/5223
                                                    257/531
(Continued)

FOREIGN PATENT DOCUMENTS

EP    0 974 817 A1    1/2000
EP    1 351 288 A1   10/2003
(Continued)

OTHER PUBLICATIONS http://www.disco.co.jp/ip/solution/apexp/polisher/gettering.html, Aug. 24, 2016, (2 pages/English translation).
(Continued)

*Primary Examiner* — Shahed Ahmed
(74) *Attorney, Agent, or Firm* — Westerman, Hattori, Daniels & Adrian, LLP

(57) ABSTRACT

The invention relates to a multilayer semiconductor integrated circuit device which is provided with a smaller space for a three-dimensional multilayer configuration at a lower cost and with a sufficient power supply quality. A first semiconductor integrated circuit device is provided with a first penetrating semiconductor region that penetrates through the first semiconductor body in the thickness direction and that is connected to the first power supply potential, and a second penetrating semiconductor region that penetrates through the first semiconductor body in the thickness direction and that is connected to the second power supply potential. A second semiconductor integrated circuit device having a first electrode and a second electrode is layered on top of the first semiconductor integrated circuit device so that the first electrode and the second electrode are respectively connected to the first penetrating semiconductor region and the second penetrating semiconductor region.

10 Claims, 28 Drawing Sheets

(51) Int. Cl.
| | |
|---|---|
| *H01L 21/48* | (2006.01) |
| *H01L 23/538* | (2006.01) |
| *H01L 23/64* | (2006.01) |
| *H01L 21/683* | (2006.01) |
| *H01L 25/18* | (2006.01) |
| *H01L 25/00* | (2006.01) |
| *H01L 27/06* | (2006.01) |
| *H01L 27/092* | (2006.01) |
| *H01L 21/768* | (2006.01) |
| *H01L 23/00* | (2006.01) |

(52) U.S. Cl.
CPC ...... *H01L 21/76898* (2013.01); *H01L 23/481* (2013.01); *H01L 23/5383* (2013.01); *H01L 23/5384* (2013.01); *H01L 23/5389* (2013.01); *H01L 23/645* (2013.01); *H01L 24/08* (2013.01); *H01L 24/09* (2013.01); *H01L 24/73* (2013.01); *H01L 24/80* (2013.01); *H01L 24/92* (2013.01); *H01L 24/94* (2013.01); *H01L 25/0657* (2013.01); *H01L 25/18* (2013.01); *H01L 25/50* (2013.01); *H01L 27/0688* (2013.01); *H01L 27/092* (2013.01); *H01L 24/05* (2013.01); *H01L 24/06* (2013.01); *H01L 24/17* (2013.01); *H01L 24/18* (2013.01); *H01L 24/29* (2013.01); *H01L 24/32* (2013.01); *H01L 24/45* (2013.01); *H01L 24/48* (2013.01); *H01L 24/81* (2013.01); *H01L 24/83* (2013.01); *H01L 2221/6834* (2013.01); *H01L 2221/68327* (2013.01); *H01L 2224/02372* (2013.01); *H01L 2224/02375* (2013.01); *H01L 2224/02377* (2013.01); *H01L 2224/02379* (2013.01); *H01L 2224/03002* (2013.01); *H01L 2224/0401* (2013.01); *H01L 2224/04042* (2013.01); *H01L 2224/05009* (2013.01); *H01L 2224/0557* (2013.01); *H01L 2224/05624* (2013.01); *H01L 2224/05647* (2013.01); *H01L 2224/06181* (2013.01); *H01L 2224/08146* (2013.01); *H01L 2224/16145* (2013.01); *H01L 2224/16227* (2013.01); *H01L 2224/16238* (2013.01); *H01L 2224/17181* (2013.01); *H01L 2224/2919* (2013.01); *H01L 2224/32145* (2013.01); *H01L 2224/32225* (2013.01); *H01L 2224/45015* (2013.01); *H01L 2224/45144* (2013.01); *H01L 2224/48091* (2013.01); *H01L 2224/48227* (2013.01); *H01L 2224/73204* (2013.01); *H01L 2224/73253* (2013.01); *H01L 2224/73257* (2013.01); *H01L 2224/80006* (2013.01); *H01L 2224/8083* (2013.01); *H01L 2224/80203* (2013.01); *H01L 2224/80986* (2013.01); *H01L 2224/81005* (2013.01); *H01L 2224/9202* (2013.01); *H01L 2224/9222* (2013.01); *H01L 2224/92125* (2013.01); *H01L 2224/92225* (2013.01); *H01L 2224/92227* (2013.01); *H01L 2224/94* (2013.01); *H01L 2225/0651* (2013.01); *H01L 2225/06513* (2013.01); *H01L 2225/06517* (2013.01); *H01L 2225/06541* (2013.01); *H01L 2225/06558* (2013.01); *H01L 2225/06565* (2013.01); *H01L 2924/00014* (2013.01); *H01L 2924/13091* (2013.01); *H01L 2924/14* (2013.01); *H01L 2924/1434* (2013.01); *H01L 2924/19107* (2013.01)

(58) Field of Classification Search
CPC ............ H01L 23/5384; H01L 23/5389; H01L 23/645; H01L 24/08; H01L 24/09; H01L 24/73; H01L 24/80; H01L 24/92; H01L 24/94; H01L 25/0652; H01L 25/0657
USPC ........ 257/713, 723, 750, 774; 438/109, 637, 438/672
See application file for complete search history.

(56) References Cited

U.S. PATENT DOCUMENTS

| | | | |
|---|---|---|---|
| 2007/0289772 A1 | 12/2007 | Kuroda et al. | |
| 2009/0152668 A1 | 6/2009 | Sone et al. | |
| 2010/0252912 A1 | 10/2010 | Murayama | |
| 2010/0308434 A1 | 12/2010 | Ikeda et al. | |
| 2011/0039493 A1 | 2/2011 | Kuroda | |
| 2011/0133295 A1 | 6/2011 | Fujii et al. | |
| 2012/0196440 A1* | 8/2012 | Botman | C23C 16/10 438/676 |
| 2013/0099312 A1 | 4/2013 | Dao et al. | |
| 2013/0320293 A1* | 12/2013 | Seo | H01L 33/36 257/9 |
| 2015/0234125 A1* | 8/2015 | Sakai | G02B 6/32 385/14 |

FOREIGN PATENT DOCUMENTS

| | | |
|---|---|---|
| JP | 2005-228981 A | 8/2005 |
| JP | 2007-250561 A | 9/2007 |
| JP | 2009-266933 A | 11/2009 |
| JP | 2010-245263 A | 10/2010 |
| JP | 2010-245371 A | 10/2010 |
| JP | 2011-139018 A | 7/2011 |
| JP | 2013-93579 A | 5/2013 |
| WO | 2009/069532 A1 | 6/2009 |

OTHER PUBLICATIONS

Kim, et al., "Ultra Thinning 300-mm Wafer down to 7-μm for 3D Wafer Integration on 45-nm Node CMOS using Strained Silicon and Cu/Low-k Interconnects", IEDM Tech. Dig., (2009), pp. 14.6.1-14.6.4, vol. 365.

Maeda et al., "Development of Sub 10-μm Ultra-Thinning Technology using Device Wafers for 3D Manufacturing of Terabit Memory", Symposium on VLSI Technology Digest of Technical Papers, 2010, pp. 105-106, vol. 105.

International Search Report dated Mar. 31, 2015, issued in counterpart International Application No. PCT/JP2014/084492 (2 pages).

Notification of Transmittal of Translation of the International Preliminary Report on Patentability (Form PCT/IPEA/409) of International Application No. PCT/JP2014/084492, dated Jun. 16, 2016. (7 pages).

Extended (Supplementary) European Search Report dated Mar. 9, 2017, issued in counterpart European Application No. 14885109.0. (8 pages).

Office Action dated Sep. 18, 2017, issued in counterpart Korean Application No. 10-2016-7027910, with English translation (10 pages).

Decision of Refusal dated Mar. 6, 2018, issued in counterpart Japanese Application No. 2016-507279, with English machine translation. (5 pages).

* cited by examiner

MULTILAYER SEMICONDUCTOR INTEGRATED CIRCUIT DEVICE

CROSS-REFERENCE TO RELATED APPLICATIONS

This application is a continuation of International Application No. PCT/JP2014/084492, filed on Dec. 26, 2014, now pending, herein incorporated by reference. Further, this application is based upon and claims the benefit of priority from the prior Japanese Patent Application No. 2014-049357, filed on Mar. 12, 2014, entire contents of which are incorporated herein by reference.

TECHNICAL FIELD

The present invention relates to a multilayer semiconductor integrated circuit device, and in particular to a structure for supplying a power supply potential between semiconductor chips that are layered on top of each other.

BACKGROUND ART

In recent years, integrated circuits of which the degree of integration has been increased by three-dimensionally layering chips on top of each other have been demanded. When memory chips are layered on top of each other, the memory capacity can be increased, and thus, the power consumption required for data transfer can be reduced. As a technology for connecting signals or power supply lines between the thus-layered chips, connection by means of wire bonding, connection by means of TAB (tape automated bonding) and connection through TSV (through silicon via) have been known.

From among the above, wire bonding has such a problem that the mounting volume increases because the chips must be layered on top of each other in such a manner that the chips are shifted from each other so as not to cover the openings for wire bonding pads for power supply. In addition, the current capacity per bonding wire is small and there is an upper limit in the number of bonding wires, and therefore, there is a problem that a sufficient power supply quality cannot be gained.

TAB provides a current capacity that is greater as compared to wire bonding, and pads for power supply can be provided in other areas than the inner periphery of the chips. However, a relatively large gap through which the tape for TAB passes through between the layered chips is required, and there is a problem such that the pitch between the chips in the direction in which the chips are layered is large.

In contrast, TSV is characterized in that all these problems can be solved. Furthermore, TSV can be used in the case where not only individual chips, but also wafers are layered on top of each other for connection, and therefore has such an advantage that the efficiency in the manufacture (throughput) is high. However, additional processes for creating holes in a silicon body, forming an insulating film on the inner wall surface of the holes, filling the holes in with an electrode, and connecting the electrodes to bumps, and therefore, there is a problem that the manufacturing costs are high.

Meanwhile, the present inventor has proposed an electronic circuit where wireless data communication is carried out between the layered chips using inductive coupling between coils formed of wires in the semiconductor integrated circuit chips, and thus has solved the above-described problems concerning data connection (see Patent Literature 1 and Patent Literature 2).

For example, the invention in Patent Literature 1 can be applied to wireless data communication using inductive coupling in a coil pair between the layered chips. In addition, the invention in Patent Literature 2 can be applied to wireless data communication between chips having the same size that are mounted so as to be layered on top of each other as well as power supply using wire bonding.

CITATION LIST

Patent Literature

Patent Literature 1: Japanese Unexamined Patent Publication 2005-228981
Patent Literature 2: International Unexamined Patent Publication WO2009/069532

Non-Patent Literature

Non-Patent Literature 1: http://www.disco.co.jp/jp/solution/apexp/polisher/gettering.html
Non-Patent Literature 2: Y. S. Kim et. al., IEDM Tech. Dig., vol. 365 (2009)
Non-Patent Literature 3: N. Maeda et al., Symp. VLSI Tech. Dig., vol. 105 (2010)
Non-Patent Literature 4: N. Maeda et al., Symp. VLSI Tech. Dig., vol. 105 (2010)

SUMMARY OF INVENTION

Problems to be Solved by the Invention

Though TSV can solve the above-described technical problems, the manufacturing costs are high, and therefore, at present, TSV has not been adopted for use in an actual production line.

Accordingly, an object of the present invention is to provide a smaller space for a three-dimensional multilayer configuration at a lower cost and with a sufficient power supply quality.

Means for Solving the Problems (1) In order to achieve the above-described object, the present invention provides a multilayer semiconductor integrated circuit device, which is characterized by being at least provided with: a first semiconductor integrated circuit device, having: a first semiconductor body; a first n type semiconductor region provided in the above-described first semiconductor body, with elements including a transistor being provided in the first n type semiconductor region; a first p type semiconductor region provided in the above-described first semiconductor body, with elements including a transistor being provided in the first p type semiconductor region; a first penetrating semiconductor region that penetrates through the above-described first semiconductor body in the thickness direction and is connected to a first power supply potential; and a second penetrating semiconductor region that penetrates through the above-described first semiconductor body in the thickness direction and is connected to a second power supply potential, and a second semiconductor integrated circuit device that forms a multilayer structure with the above-described first semiconductor integrated circuit device, the second semiconductor integrated circuit device having: a first electrode electrically connected to the first penetrating semiconductor region; and a second electrode connected to the above-described second penetrating semiconductor region.

Thus, a penetrating semiconductor region having a high impurity concentration is used instead of TSV of which the manufacturing costs are high, and therefore, the chips can be layered without being shifted from each other, and a sufficient power supply quality can be provided, and in addition, it is possible to make the pitch smaller between chips in the direction in which the chips are layered.

(2) In addition, the present invention provides the multilayer semiconductor integrated circuit device according to the above (1), which is characterized in that the above-described second semiconductor integrated circuit device has: a second semiconductor body; a second n type semiconductor region provided in the above-described second semiconductor body, with elements including a transistor being provided in the second n type semiconductor region; a second p type semiconductor region provided in the above-described second semiconductor body, with elements including a transistor being provided in the second p type semiconductor region; a third penetrating semiconductor region that penetrates through the above-described second semiconductor body in the thickness direction and is connected to the above-described first power supply potential; and a fourth penetrating semiconductor region that penetrates through the above-described second semiconductor body in the thickness direction and is connected to the above-described second power supply potential, and the above-described first electrode electrically connected to the above-described third penetrating semiconductor region and the above-described second electrode electrically connected to the above-described fourth penetrating semiconductor region are provided in the multilayer semiconductor integrated circuit device.

Thus, a penetrating semiconductor region can be provided to the second semiconductor integrated circuit device so that it can be made possible to layer three or more chips on top of each other.

(3) Furthermore, the present invention provides the multilayer semiconductor integrated circuit device according to the above (2), which is characterized in that the arrangement of the elements in the above-described first semiconductor integrated circuit device and the arrangement of the elements in the above-described second semiconductor integrated circuit device are the same. Thus, the arrangement of the elements in each semiconductor integrated circuit device is made the same so that a memory device having a large capacity can be implemented at a lower cost, for example.

(4) Moreover, the present invention provides the multilayer semiconductor integrated circuit device according to the above (2), which is characterized in that the arrangement of the elements in the above-described first semiconductor integrated circuit device and the arrangement of the elements in the above-described second semiconductor integrated circuit device are different. Thus, the arrangement of the elements in each semiconductor integrated circuit device is made different so that a multifunctional semiconductor device where memories and logic circuits are mixed together can be implemented at a low cost, for example.

(5) In addition, the present invention provides the multilayer semiconductor integrated circuit device according to any of the above (1) through (4), which is characterized in that a number of semiconductor integrated circuit devices that are the same as the above-described first semiconductor integrated circuit device and include the above-described first semiconductor integrated circuit device are layered on top of each other. Such a multilayer structure can be provided in order to implement a multilayer semiconductor integrated circuit device where the first semiconductor integrated circuit device is a non-volatile memory and the second semiconductor integrated circuit device is a controller chip, for example.

(6) Furthermore, the present invention provides the multilayer semiconductor integrated circuit device according to any of the above (1) through (5), which is characterized in that the resistance value in the above-described first penetrating semiconductor region and the above-described second penetrating semiconductor region is 3 mΩ or less. Thus, the resistance value in the penetrating semiconductor regions is made 3 mΩ or less so that the resistance value of the power supply line can be lowered by one digit as compared to a case where Au wires are used. In order to realize such a resistance value, the impurity concentration in the penetrating semiconductor regions may be made high, and at the same time, the area of the penetrating semiconductor regions in the plane may be made large.

(7) Moreover, the present invention provides the multilayer semiconductor integrated circuit device according to any of the above (1) through (5), which is characterized in that the thickness of the above-described first semiconductor body is 10 μm or less. Thus, the thickness of the first semiconductor body can be made 10 μm or less so that a sufficient power supply quality can be guaranteed by using a current ion implanter.

(8) In addition, the present invention provides the multilayer semiconductor integrated circuit device according to the above (7), which is characterized in that the thickness of the above-described first semiconductor body is 5 μm or less. Thus, the thickness of the semiconductor body can be made as thin as 5 μm or less so that the penetrating semiconductor regions where a sufficient power supply quality can be guaranteed can be formed by using a type of ion implanter that is widely available at present.

(9) Furthermore, the present invention provides the multilayer semiconductor integrated circuit device according to any of the above (1) through (8), which is characterized in that the above-described first penetrating semiconductor region is of the same conductivity type as the above-described first semiconductor body, and the above-described second penetrating semiconductor region is of the opposite conductivity type to the above-described first semiconductor body. Such a combination of the conductivity types can prevent the first penetrating semiconductor region and the second penetrating semiconductor region from short circuiting.

(10) Moreover, the present invention provides the multilayer semiconductor integrated circuit device according to any of the above (1) through (8), which is characterized in that the above-described first penetrating semiconductor region and the above-described second penetrating semiconductor region are of the same conductivity type as the above-described first semiconductor body, and the above-described second penetrating semiconductor region is electrically separated from the above-described first semiconductor body by a layer of the opposite conductivity type. Thus, a layer of the opposite conductivity type can be provided so that the penetrating semiconductor regions of the same conductivity type can be used in such a manner that one penetrating semiconductor region is connected to a first power supply potential ($V_{SS}$) and the other penetrating semiconductor region is connected to a second power supply potential ($V_{DD}$).

(11) In addition, the present invention provides the multilayer semiconductor integrated circuit device according to any of the above (1) through (10), which is characterized in that a semiconductor region of the same conductivity types as the above-described first semiconductor body within the above-described first p type semiconductor region or the above-described first n type semiconductor region is electrically separated from the above-described first semiconductor body by a separation layer of the opposite conductivity type, and the above-described separation layer of the opposite conductivity type is exposed from the rear surface of the above-described first semiconductor body. Thus, in the case where one semiconductor region is electrically separated from the semiconductor body by a region of the opposite conductivity type, that is to say, a deep well region, the deep well region may be exposed from the rear surface of the first semiconductor body.

(12) Furthermore, the present invention provides the multilayer semiconductor integrated circuit device according to any of the above (1) through (11), which is characterized in that the above-described first semiconductor integrated circuit device and the above-described second semiconductor integrated circuit device have a coil for transmitting and receiving a signal. Thus, it is desirable to use inductive coupling between the coils for the transmission and reception of a signal. That is to say, in the case where a penetrating semiconductor region is used as a signal line, high speed data communication is made impossible due to a signal delay caused by a high resistance value of the penetrating semiconductor region, and therefore, inductive coupling data communication using coils, which makes electrical signal lines unnecessary, is optimal.

(13) Moreover, the present invention provides the multilayer semiconductor integrated circuit device according to the above (12), which is characterized in that the above-described first semiconductor integrated circuit device has at least a penetrating semiconductor region for a signal of the opposite conductivity type to the above-described first semiconductor body or a penetrating semiconductor region for a signal of the same conductivity type as the above-described first semiconductor body that is separated from the above-described first semiconductor body by a separation layer of the opposite conductivity type to the above-described first semiconductor body. In the case of a low speed signal such as a chip selection signal, the penetrating semiconductor regions can be used for a signal. In this case, it is necessary for a penetrating semiconductor region for a signal to be a penetrating semiconductor region of the opposite conductivity type to the first semiconductor body or a penetrating semiconductor region of the same conductivity type as the first semiconductor body that is separated from the first semiconductor body by a separation layer of the opposite conductivity type to the first semiconductor body in order to prevent a leak current from flowing vis-à-vis the first semiconductor body when the signal becomes high.

(14) In addition, the present invention provides the multilayer semiconductor integrated circuit device according to the above (13), which is characterized in that the frequency of a signal that propagates through the above-described penetrating semiconductor layer for a signal is 100 MHz or lower. Thus, in the case of a low speed signal of 100 MHz or lower, in particular, a low speed signal of 10 MHz or lower such as a chip selection signal, the signal can propagate sufficiently.

(15) Furthermore, the present invention provides the multilayer semiconductor integrated circuit device according to the above (13) or (14), which is characterized in that the above-described second semiconductor integrated circuit device has at least a penetrating semiconductor region for a signal of the opposite conductivity type to the above-described second semiconductor body or a penetrating semiconductor region for a signal of the same conductivity type as the above-described second semiconductor body that is separated from the above-described second semiconductor body by a separation layer of the opposite conductivity type to the above-described second semiconductor body, and the penetrating semiconductor region for a signal provided in the above-described first semiconductor body and the semiconductor region for a signal provided in the above-described second semiconductor body overlap in the direction in which the first and second semiconductor integrated circuit devices are layered. Thus, the penetrating semiconductor region for a signal provided in the first semiconductor body and the semiconductor region for a signal provided in the semiconductor body can be provided in such a manner as to overlap in the direction in which the first and second semiconductor integrated circuit devices are layered so that connection wires are made unnecessary for the connection between the first and second semiconductor bodies.

Advantageous Effects of the Invention

The use of the disclosed multilayer semiconductor integrated circuit device makes it possible to provide a smaller space for a three-dimensional multilayer configuration at a lower cost and with a sufficient power supply quality.

DESCRIPTION OF EMBODIMENTS

Figure 1:
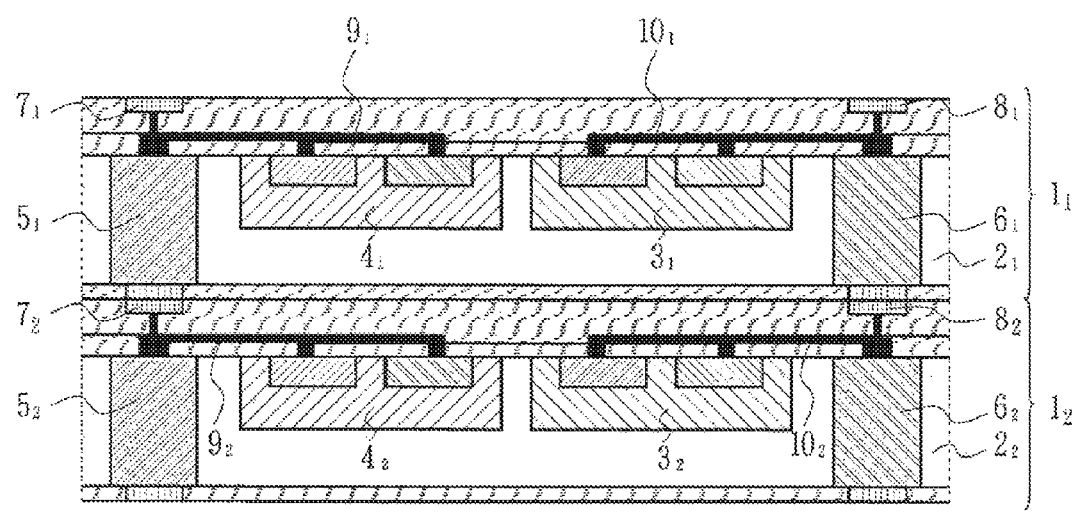
FIG. 1 is a schematic cross-sectional diagram illustrating the multilayer semiconductor integrated circuit device according to an embodiment of the present invention.

Here, the multilayer semiconductor integrated circuit device according to an embodiment of the present invention is described in reference to FIGS. 1 through 4B. FIG. 1 is a schematic cross-sectional diagram illustrating the multilayer semiconductor integrated circuit device according to the embodiment of the present invention, which has a two-layer structure of a first semiconductor integrated circuit device $1_1$ and a second semiconductor integrated circuit device $1_2$ that have the same element structure.

In the first semiconductor integrated circuit device $1_1$, a first n type semiconductor region $3_1$ and a first p type semiconductor region $4_1$ are provided in a first semiconductor body $2_1$ as conventional semiconductor element regions. Here, the first semiconductor body $2_1$ is provided with a first penetrating semiconductor region $5_1$ and a second penetrating semiconductor region $6_1$ that penetrate through the first semiconductor body $2_1$ and are used as power supply wires. Thus, the first penetrating semiconductor region $5_1$ and the second penetrating semiconductor region $6_1$ are used as power supply wires so that the manufacturing costs can be greatly reduced. Here, the semiconductor body means a semiconductor substrate, a multilayer structure having a semiconductor substrate and an epitaxial growth layer provided on top of the semiconductor substrate, or an epitaxial growth layer gained by removing the semiconductor substrate from a multilayer structure.

In the second semiconductor integrated circuit device $1_2$ as well, a second n type semiconductor region $3_2$ and a second p type semiconductor region $4_2$ are provided in a second semiconductor body $2_2$ as conventional semiconductor element regions. In addition, the second semiconductor body $2_2$ is provided with a third penetrating semiconductor region $5_2$ and a fourth penetrating semiconductor region $6_2$ that penetrate through the second semiconductor body $2_2$ and are used as power supply wires. Here, it is not necessary for the second semiconductor integrated circuit device $1_2$ to have the same structure as the first semiconductor integrated circuit device $1_1$, and in the case where the second semiconductor integrated circuit device $1_2$ is used in the final layer of the multilayer structure, the third penetrating semiconductor region $5_2$ and the fourth penetrating semiconductor region $6_2$ are not necessary.

Figure 2A:
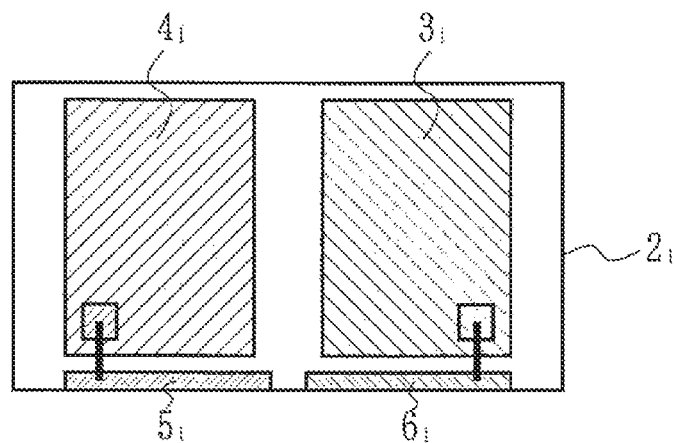
FIGS. 2A through 2C are diagrams illustrating examples of the arrangement of the penetrating semiconductor regions in the multilayer semiconductor integrated circuit device according to the embodiment of the present invention.
Figure 2B:
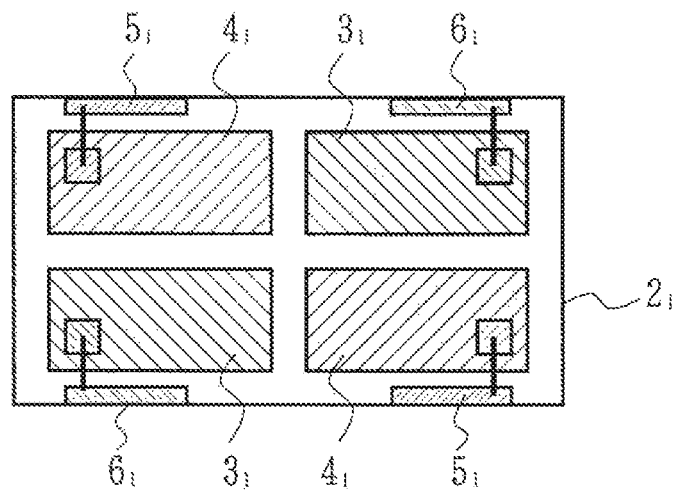
Figure 2C:
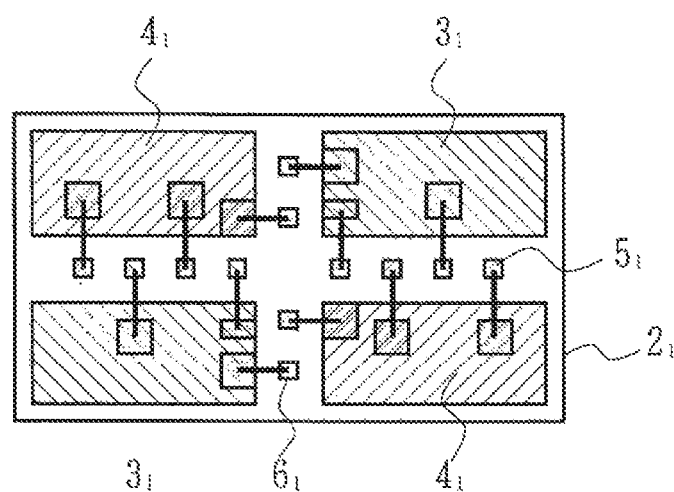

FIGS. 2A through 2C are diagrams illustrating examples of the arrangement of the penetrating semiconductor regions in the multilayer semiconductor integrated circuit device according to the embodiment of the present invention. FIG. 2A illustrates an example where the first penetrating semiconductor region $5_1$ and the second penetrating semiconductor region $6_1$ are provided along one side of the first semiconductor body $2_1$, that is, a semiconductor chip. FIG. 2B illustrates an example where the first penetrating semiconductor region $5_1$ and the second penetrating semiconductor region $6_1$ are respectively divided into two regions so as to be provided along the two sides of the first semiconductor body $2_1$ that face each other. FIG. 2C illustrates an example where the first penetrating semiconductor region $5_1$ and the second penetrating semiconductor region $6_1$ are divided into microscopic regions that are provided in the first semiconductor body $2_1$. In all the cases, a certain area can be secured in total in the plane so that the resistance value of the wires can be made sufficiently low.

In this case, the resistance value of the wires, that is to say, the sum of the resistance value in the penetrating semiconductor regions and the resistance value of the contacts between the penetrating semiconductor regions and the contact electrodes, can be made sufficiently small, typically 3 mΩ or lower, so that the power supply quality can be made sufficiently high. Incidentally, the resistance value of the Au wires becomes 20 mΩ when the diameter of the Au wires for bonding is 25 μm, the length is 0.5 mm, and the electrical resistivity is $2.21 \times 10^{-8}$ Ωm. Accordingly, 3 mΩ is sufficiently low as compared to the resistance of conventional bonding wires, and thus, a sufficiently high power supply quality can be gained.

Even in the case where the impurity concentration in the penetrating semiconductor regions is high, however, the electrical resistivity of the penetrating semiconductor regions, which is $4.2 \times 10^{-4}$ Ωm, for example, is higher by approximately four digits as compared to the electrical resistivity of gold or copper that is used for bonding wires, TAB or TSV, which is $2.21 \times 10^{-8}$ Ωm or $1.68 \times 10^{-8}$ Ωm. Accordingly, the value gained by dividing the cross-sectional area by the thickness of the chip needs to be approximately 10,000 times higher in order to gain the same resistance value, and therefore, the use of the penetrating semiconductor regions for penetrating electrodes including signal lines has not been attempted. As a result of diligent examination, however, it has been confirmed that the penetrating semiconductor regions can be used for power supply based on the fact that the resistance value of the penetrating semiconductor regions in the vertical direction is $4.2 \times 10^{-4}$ [Ωm]*$5 \times 10^{-6}$ [m]/{$0.1 \times 10^{-3}$ [m]*$7 \times 10^{-3}$ [m]}≈3 mΩ when the thickness of the chips is 5 μm and the size of the penetrating semiconductor regions in a plane pattern is 0.1 mm×7 mm, for example.

As described above, the size of the penetrating semiconductor regions in a plane pattern in order to achieve an electrical resistivity of 3 mΩ is 0.1 mm×7 mm with the cross-sectional area being 700,000 μm², for example. This is 400 times or higher as compared to the cross-sectional area of TSV, which is 40 μm×40 μm (=1,600 μm²), for example. As a result of diligent examination, however, conventional memory chips have a side of 7 mm or longer, and in the case of a NAND flash memory, the long sides are 14 mm or longer, and therefore, it was found that approximately two high concentration wells of 0.1 mm×7 mm can be provided for power supply wires at a relatively low cost. It is impossible to provide high concentration wells for signal lines, which usually become 100 or more wires, due to the area limitation. In the case where the area of the high concentration wells is reduced to such an extent that wires can be provided, the electrical resistance value becomes very high, which greatly lowers the signal level, and therefore, such high concentration wells cannot be used as signal wires. This means that the penetrating semiconductor regions can be used as signal wires in the case of a low speed signal of 100 MHz or lower such as a chip selection signal, and as an example, a low speed signal of 10 MHz or lower such as a chip selection signal.

Figure 3A:
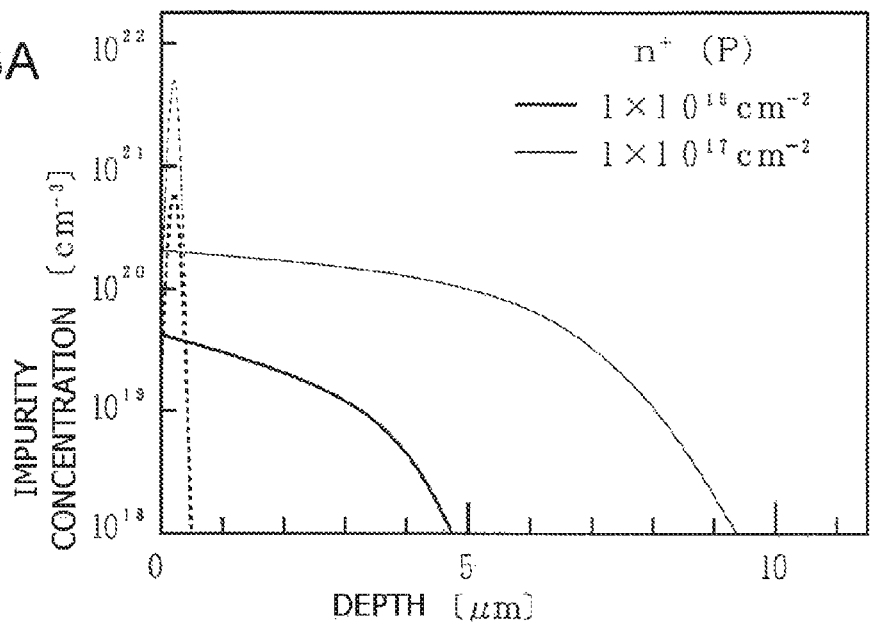
FIGS. 3A and 3B are graphs illustrating the impurity concentration distribution after annealing.

Here, the issue is with the impurity concentration of the penetrating semiconductor regions and the thickness in the direction of the substrate, and therefore, the possibility of the penetrating semiconductor regions being used as power supply wires is examined in reference to FIGS. 3A through 4B. FIGS. 3A and 3B are graphs illustrating the impurity concentration distribution after annealing. FIG. 3A illustrates the impurity concentration distribution of P, and FIG. 3B illustrates the impurity concentration distribution of B. Here, the results of simulation of the impurity profile in the penetrating semiconductor regions using TCAD are illustrated.

The simulation prerequisites in this case were as follows. The semiconductor substrate was a p type high resistance substrate (7 Ωm) with the thickness of the oxide film on the surface being 10 nm. As for the impurities, $n^+$ was phosphorous (P) and $p^+$ was boron (B). Two dosages, $1 \times 10^{16}$ cm$^{-2}$ and $1 \times 10^{17}$ cm$^{-2}$, were examined. The energy for ion implantation was 200 keV. The conditions for heat treatment for activation were 50 hours at 1,050° C.

The conditions in this case were the same as the conditions for manufacturing a conventional integrated device, except for the following two points.
1) The period of time for the diffusion is usually ten minutes or less. In the case where the high concentration wells were diffused prior to the process for manufacturing a conventional device, however, the performance of the conventional device was not affected.
2) The dosage is usually $1 \times 10^{15}$ cm$^{-2}$. However, $1 \times 10^{16}$ cm$^{-2}$ is possible even when a conventional ion implanter for mass production is used. In addition, manufacturing units exist that make an ion implantation of $1 \times 10^{17}$ cm$^{-2}$ possible. Thus, the conditions for simulation were almost the same as the conditions for mass production. In addition, the size of the penetrating semiconductor regions in the plane pattern was 0.1 mm×7 mm as described above.

Figure 3B:
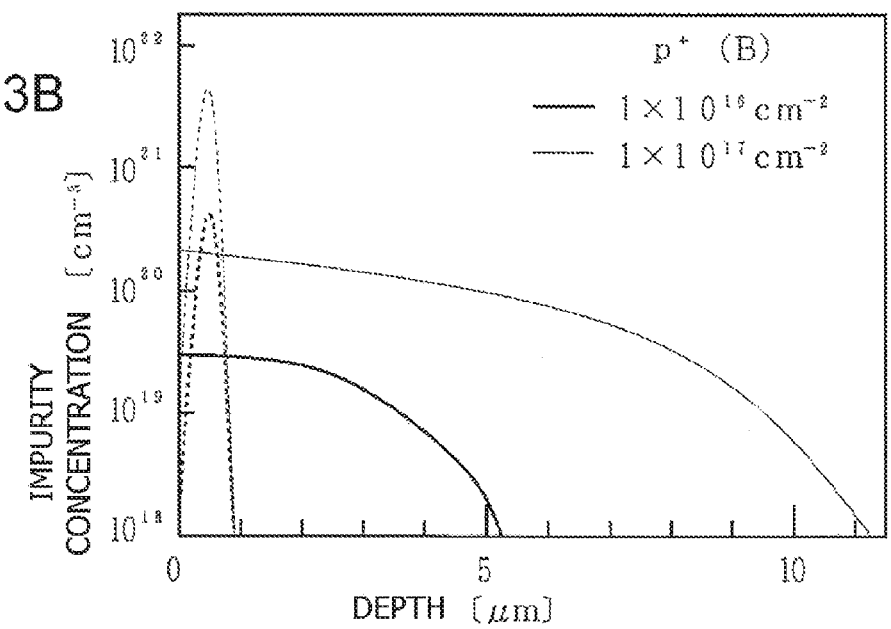

As is clear from FIGS. 3A and 3B, the higher the dosage is, the deeper the high concentration region is in both the phosphorous and boron cases. It can also be seen that the high concentration region of boron diffuses deeper than that of phosphorous. Here, the broken lines in the graphs indicate the profiles immediately after ion implantation.

Figure 4A:
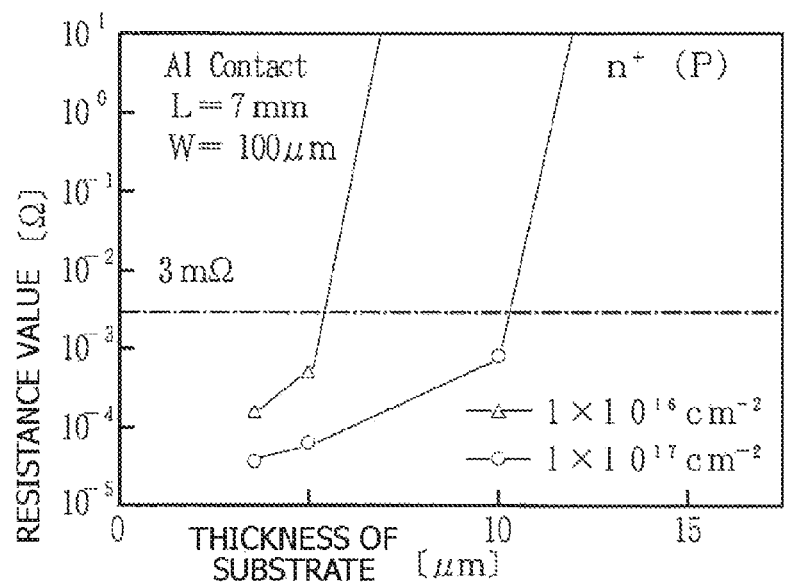
FIGS. 4A and 4B are graphs illustrating the dependency of the resistance value on the thickness of the substrate.
Figure 4B:
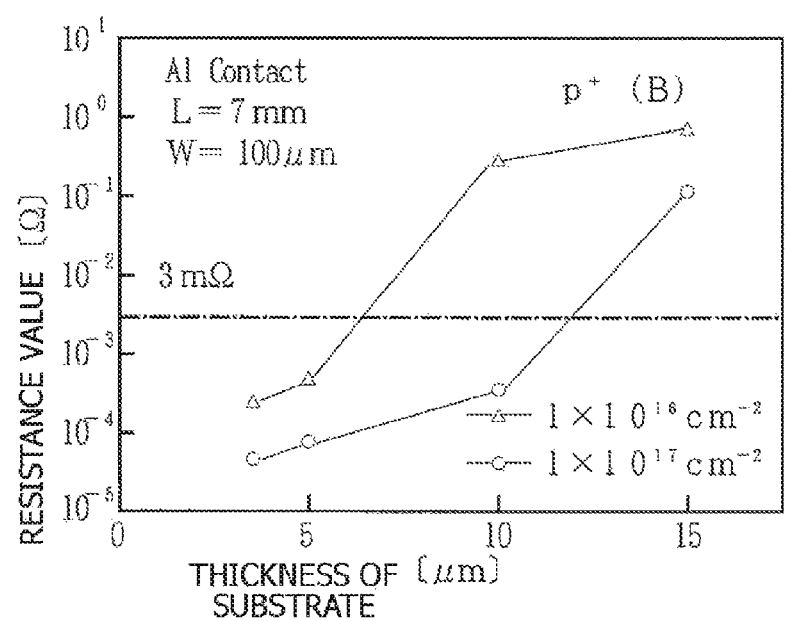

FIGS. 4A and 4B are graphs illustrating the dependency of the resistance value on the thickness of the substrate, which is the result of calculation of the resistance value between the front surface electrode and the rear surface electrode of the penetrating semiconductor regions when the thickness of the substrate is changed on the basis of the results in FIGS. 3A and 3B. Here, the front surface electrode and the rear surface electrode are made of aluminum having a thickness of 200 nm. The junction resistance between each electrode and a high concentration penetrating semiconductor region is calculated as an ohmic contact, taking the difference in the Fermi level between silicon and aluminum into consideration, and therefore, the difference in the resistance value depending on the impurity concentration on the rear surface and the difference in the conductivity type, n type or p type, is reflected in the calculation.

As is clear from FIGS. 4A and 4B, penetrating semiconductor regions having a value of 3 mΩ where phosphorous is used as the n type impurity and boron is used as the p type impurity can be realized in the case where the thickness of the semiconductor body is made as thin as 5 μm. It can also be seen that in the case where the dosage is increased by one digit to $1 \times 10^{17}$ cm$^{-2}$, penetrating semiconductor regions having a resistance value of 3 mΩ can be realized even when the thickness of the semiconductor body is 10 μm.

Next, the effects of the thickness of the substrate on the element properties are examined. Though the thickness of the semiconductor body (not including wire layers) is greater than the thickness of the N$^-$ wells and P$^-$ wells that provide element formation regions for a conventional device, it is necessary for the thickness of the semiconductor body to be 5 μm or 10 μm, which is very thin as compared to the typical thickness in the prior art, which is 40 μm, as described above. Thus, in the case of a semiconductor body that is very thin, there is a risk that the performance of the elements will deteriorate in such a manner that the leakage through pn junctions will increase due to metal contamination.

A technology for creating micro-cracks when the rear surface of a semiconductor substrate is polished and capturing (gettering) heavy metal impurities by using these micro-cracks as gettering sites has been developed in recent years (see Non-Patent Literature 1). As a result, it has been reported that the performance of the CMOS logic integrated circuits does not deteriorate even when the thickness of the chip is reduced to 7 μm, for example (see Non-Patent Literature 2). It has also been reported that the performance of the FRAM (registered trademark) memory integrated circuits does not deteriorate even when the thickness of the chip is reduced to 9 μm (see Non-Patent Literature 3). Accordingly, the elements can exercise a sufficient performance when the thickness of the semiconductor body is 10 μm or less.

As a result of the above-described examinations for various types of conditions, it was confirmed for the first time that penetrating semiconductor regions can be used as power supply wires when impurities P and B with a dosage of $1 \times 10^{16}$ cm$^{-2}$ to $1 \times 10^{17}$ cm$^{-2}$ are implanted into areas of 0.7 mm$^2$ or greater on a semiconductor body having a thickness of 10 μm or less with a voltage for acceleration of approximately 200 keV. As described above, penetrating semiconductor regions cannot be adopted as signal lines, and therefore, it is desirable for the inductive coupling data communication between the coils to be used for the transmission and reception of a signal.

When semiconductor integrated circuit devices are layered on top of each other, a first semiconductor integrated circuit device is fixed to a support substrate, which is then polished to a thin layer having a thickness of approximately 2 μm to 10 μm, and thus, rear surface electrodes are formed on the exposed surface of the penetrating semiconductor regions. Next, a second semiconductor integrated circuit device having the same element structure or a different element structure is layered in such a manner that the front surface electrodes make contact with the rear surface electrodes on the first semiconductor integrated circuit device. In the case where more devices are layered, the second semiconductor integrated circuit device is also polished so that the high impurity concentration regions become penetrating semiconductor regions. Here, the penetrating semiconductor regions are high impurity concentration regions, and therefore, the contact electrodes and the rear surface electrodes may be made of Al or Cu. Chips do not need pads when being layered, and therefore, the front surface electrodes may be formed on the top layer of the multilayer wires made of Cu, for example. Here, a multilayer structure made of a contact layer (TiN, TaN)/a barrier layer (TiW, TaN)/a metal may be adopted in order to achieve excellent ohmic contact. Alternatively, the devices may be layered in such a manner that the front surface electrodes face each other or the rear surface electrodes face each other. Furthermore, because the formation of the rear surface electrodes is costly, a semiconductor integrated circuit device may be layered on top of another semiconductor integrated circuit device in a state where the penetrating semiconductor regions with a high impurity concentration are exposed without forming rear surface electrodes in such a manner that the exposed penetrating semiconductor regions make contact with the front surface electrodes of the other semiconductor integrated circuit device. Here, the depth of the diffusion of impurities is approximately proportional to the square root of the period of time of heat treatment. Accordingly, in the case where the thickness of a layer is reduced to half, from 5 μm to 2.5 μm, for example, the period of time of heat treatment becomes (2.5 μm/5 μm)$^2$=¼, and thus can be shortened to 50 hours×¼=12.5 hours.

It is possible to further reduce the electrical resistance of the penetrating semiconductor regions by implanting ions from the rear surface of the semiconductor substrate after the semiconductor substrate has been made thinner. However, this would be the step after the formation of element regions, and the possibility of the element properties being affected by the annealing for activation is high, and therefore, this is not desirable.

Such a layering step may be carried out at the stage where the devices are still on a wafer or at the stage where the devices are in chips. Furthermore, wafers that have been reconstructed through KGD (known good die) may be used. That is to say, good chips are found as a result of testing on a wafer, which is then diced into individual chips. The defective chips are discarded and only the good chips are rearranged on a support substrate in a wafer form, and then, the good chips are fixed by means of an adhesive, and thus, a wafer is reconstructed.

Example 1

Figure 5A:
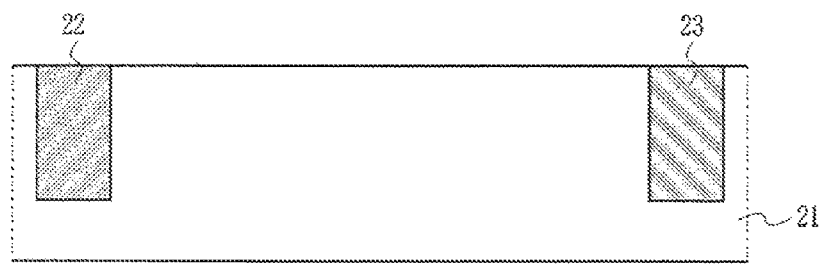
FIGS. 5A through 5C are diagrams illustrating the multilayer semiconductor integrated circuit device according to Example 1 of the present invention up to a certain step in the manufacturing process.

Next, the multilayer semiconductor integrated circuit device according to Example 1 of the present invention is described in reference to FIGS. 5A through 10K as an example where three memory chips that are the same are layered on top of each other. As illustrated in FIG. 5A, first, B ions with a dosage of $1 \times 10^{16}$ cm$^{-2}$ are implanted into a p$^-$ type Si substrate 21 with an energy for acceleration of 200 keV so as to form a p$^{++}$ type well region 22 having a size of 0.1 mm×7 mm, and then, P ions with a dosage of $1 \times 10^{16}$ cm$^{-2}$ are implanted into the p$^-$ type Si substrate 21 with an energy for acceleration of 200 keV so as to form an n$^{++}$ type well region 23 having a size of 0.1 mm×7 mm. Next, heat treatment is carried out for 50 hours at 1,050° C. so that the implanted ions are activated, and at the same time are diffused deeper in the direction of the thickness of the substrate. Here, the oxide film formed on the surface of the substrate as a result of heat treatment is removed if necessary.

Figure 5B:
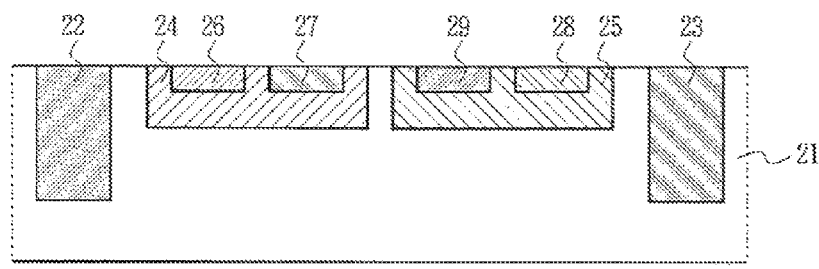

Next, as illustrated in FIG. 5B, a p type well region 24 and an n type well region 25 that become element formation regions are formed on the p$^-$ type Si substrate 21 in the same manner as in a conventional manufacturing process. Next, a p⁺ type substrate contact region 26 is formed in the p type well region 24, and at the same time, an n type region 27 that becomes a source region, a drain region or the like is formed, and then, a gate electrode (not shown) is provided so as to form an n channel MOSFET. Meanwhile, an n⁺ type substrate contact region 28 is formed in the n type well region 25, and at the same time, a p type region 29 that becomes a source region, a drain region or the like is formed, and then, a gate electrode (not shown) is provided so as to form a p channel MOSFET.

Figure 5C:
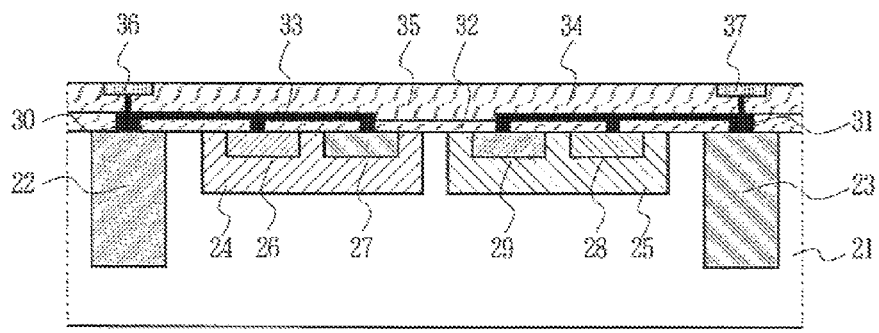

Next, as illustrated in FIG. 5C, contact electrodes 30 and 31 are formed of Cu on the surface of the p⁺⁺ type well region 22 and the n⁺⁺ type well region 23, and then, a wire layer 33, 34 is formed in accordance with a multilayer wiring technology. Next, a front surface electrode 36 is formed of Al or Cu so as to be connected to the contact electrode 30, and a front surface electrode 37 is formed of Al or Cu so as to be connected to the contact electrode 31. At this time, coils (not shown) for inductive coupling data communication are formed of multilayer wires. In addition, polishing is carried out in order to flatten the surface. Here, 32 and 35 in the figure indicate interlayer insulating films made of $SiO_2$.

Figure 6D:
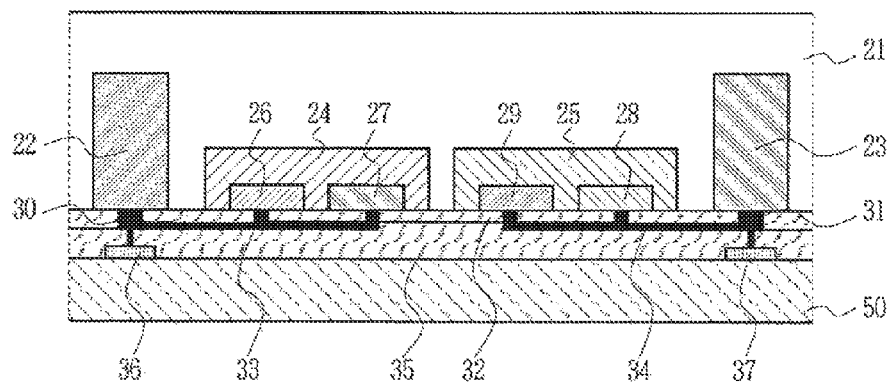
FIGS. 6D and 6E are diagrams illustrating the multilayer semiconductor integrated circuit device according to Example 1 of the present invention in the next step and up to a certain step after the step in FIG. 5C in the manufacturing process.
Figure 6E:
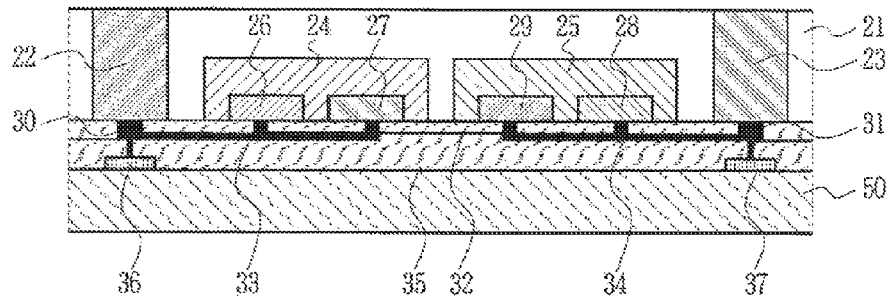

Next, as illustrated in FIG. 6D, the p⁻ type Si substrate 21 is temporarily joined to a support substrate 50 made of an Si substrate in such a manner that the surface on which the front surface electrodes 36 and 37 are formed makes contact with the support substrate 50. Next, as illustrated in FIG. 6E, the p⁻ type Si substrate 21 is ground to a predetermined thickness, followed by polishing in accordance with a chemical mechanical polishing (CMP) method to a thickness of 5 μm.

Figure 7F:
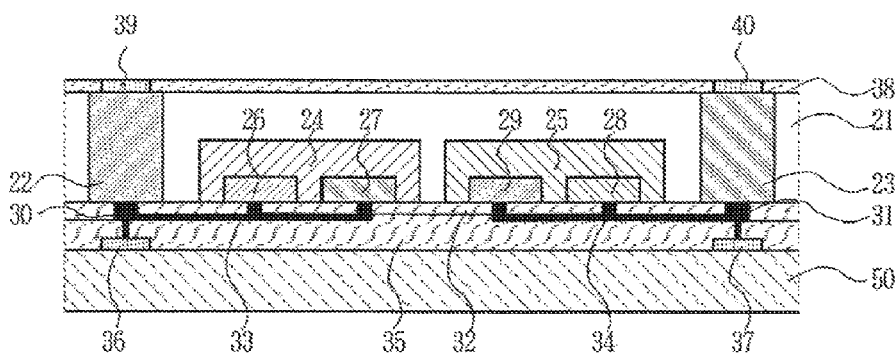
FIGS. 7F and 7G are diagrams illustrating the multilayer semiconductor integrated circuit device according to Example 1 of the present invention in the next step and up to a certain step after the step in FIG. 6E in the manufacturing process.

Next, as illustrated in FIG. 7F, an $SiO_2$ protective film 38 is formed on the polished surface, and after that, openings are created so that the p⁺⁺ type well region 22 and the n⁺⁺ type well region 23 are exposed, and rear surface electrodes 39 and 40 are formed of Al or Cu. At this time as well, polishing is carried out in order to flatten the surface.

Figure 7G:
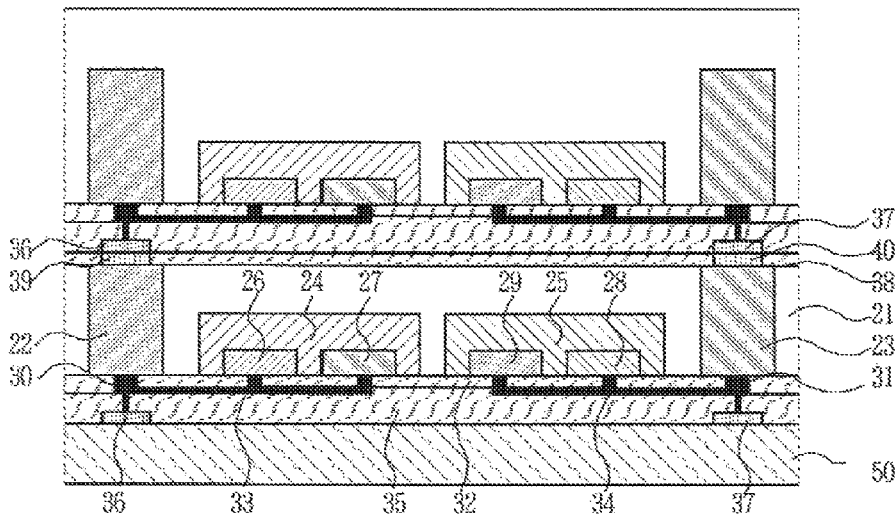

Next, as illustrated in FIG. 7G, another semiconductor wafer that has been fabricated in the process up to the step in FIG. 5C is layered on the top. At this time, the rear surface electrodes 39 and 40 of the semiconductor integrated circuit device in the first tier makes contact with the front surface electrodes 36 and 37 of the semiconductor integrated circuit device in the second tier. At this time, the electrodes are joined through ordinary temperature pressure applying connection between the metal surfaces after the metal surfaces have been activated, that is to say, through solid phase connection by means of the diffusion of metal.

Figure 8H:
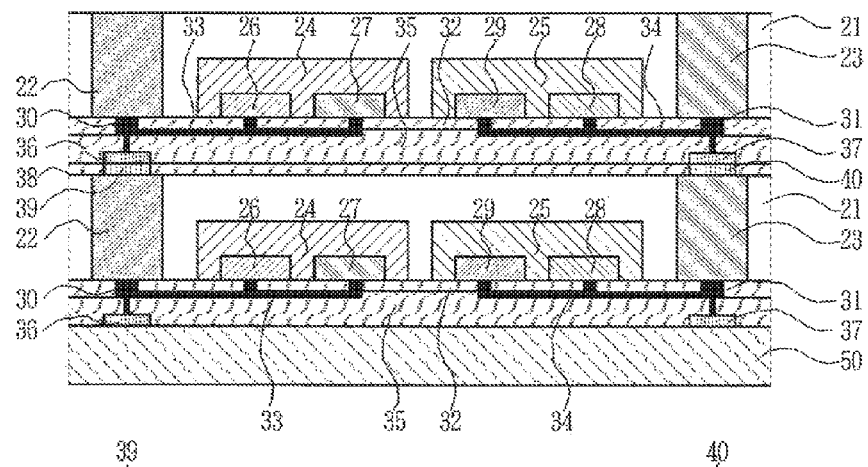
FIGS. 8H and 8I are diagrams illustrating the multilayer semiconductor integrated circuit device according to Example 1 of the present invention in the next step and up to a certain step after the step in FIG. 7G in the manufacturing process.

Next, as illustrated in FIG. 8H, the p⁻ type Si substrate 21 in the second tier is ground to a predetermined thickness, followed by polishing in accordance with a chemical mechanical polishing method to a thickness of 5 μm.

Figure 8I:
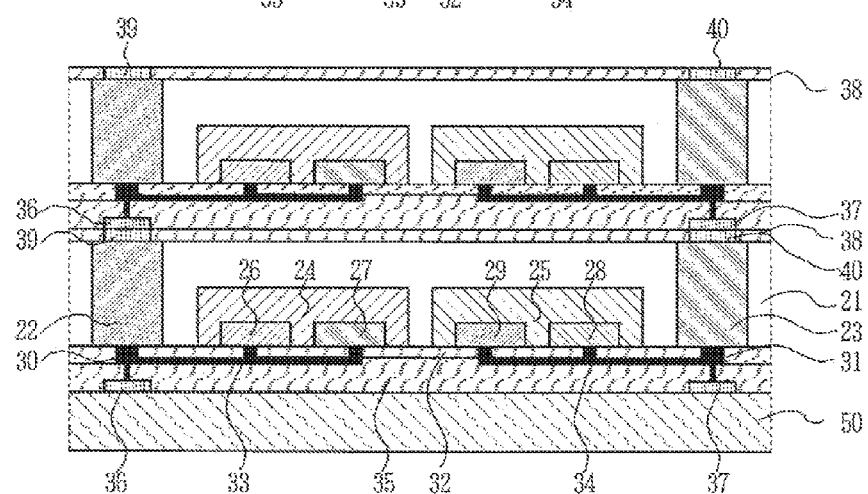
Figure 9J:
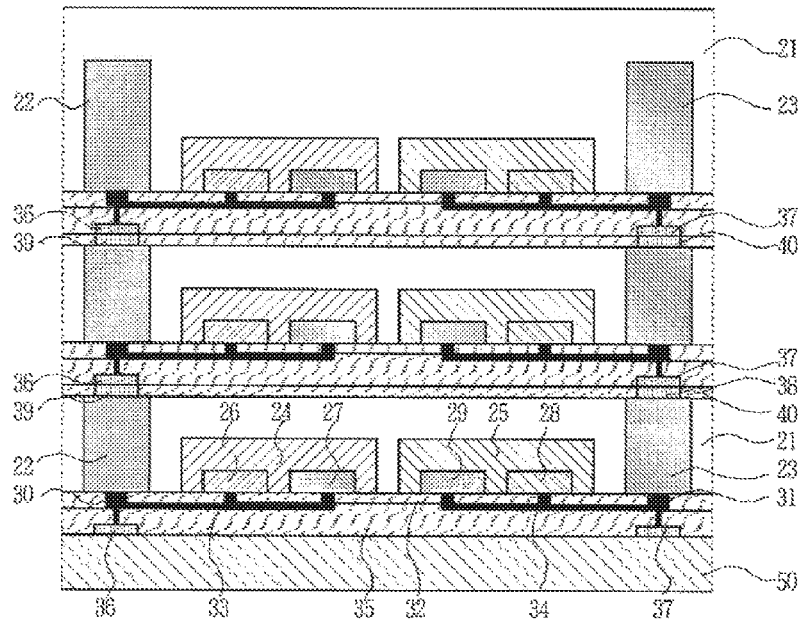
FIG. 9J is a diagram illustrating the multilayer semiconductor integrated circuit device according to Example 1 of the present invention in the next step and up to a certain step after the step in FIG. 8I in the manufacturing process.

Next, as illustrated in FIG. 8I, an $SiO_2$ protective film 38 is again formed on the polished surface, and after that, openings are created so as to expose the p⁺⁺ type well region 22 and the n⁺⁺ type well region 23, and then, rear surface electrodes 39 and 40 are formed of Al or Cu. At this time as well, polishing is carried out in order to flatten the surface.

Next, as illustrated in FIG. 9), another semiconductor wafer that has been fabricated in the process up to the step in FIG. 5C is again layered on the top. At this time as well, the rear surface electrodes 39 and 40 of the semiconductor integrated circuit device in the second tier make contact with the front surface electrodes 36 and 37 of the semiconductor integrated circuit device in the third tier. At this time as well, the electrodes are joined through ordinary temperature pressure applying connection between the metal surfaces after the metal surfaces have been activated, that is to say, through solid phase connection by means of the diffusion of metal.

Figure 10K:
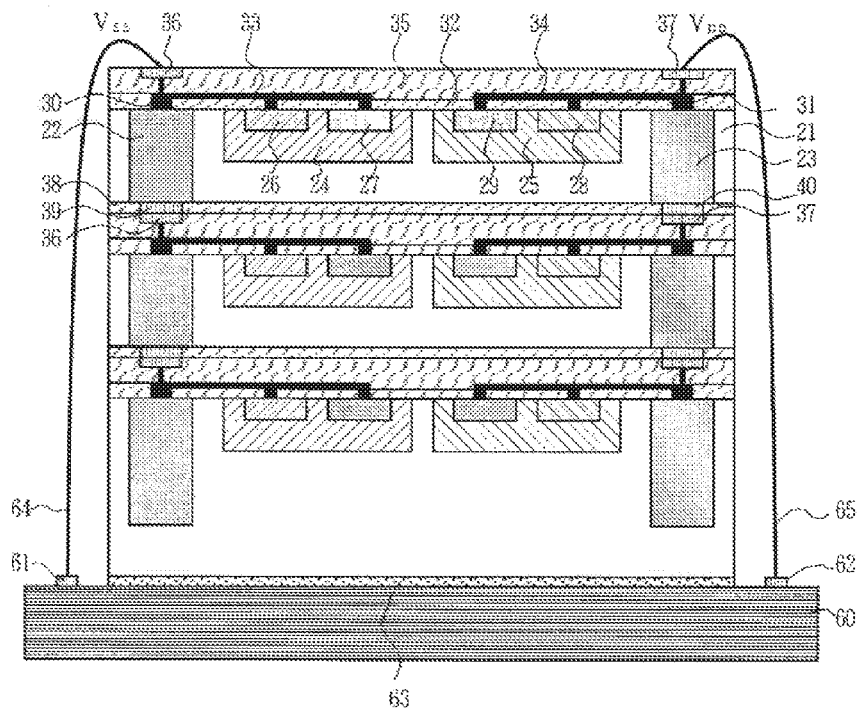
FIG. 10K is a diagram illustrating the multilayer semiconductor integrated circuit device according to Example 1 of the present invention in the next step after the step in FIG. 9J in the manufacturing process.

Next, as illustrated in FIG. 10K, the layered wafers are removed from the support substrate 50 and divided into chips of a predetermined size, and after that, each chip is fixed onto a package substrate 60 by means of an adhesive 63. Next, a power supply pad 61 to which $V_{SS}$ is to be applied and the front surface electrode 36 that is connected to the p⁺⁺ type well region 22 are connected through a bonding wire 64. In addition, a power supply pad 62 to which $V_{DD}$ is to be applied and the front surface electrode 37 that is connected to the n⁺⁺ type well region 23 are connected through a bonding wire 65, and thus, the basic structure of the multilayer semiconductor integrated circuit device according to Example 1 of the present invention is complete. Here, it is desirable for thickness of the p⁻ type Si substrate in the third tier to not be reduced from the points of view of ease in handling and securing the mechanical strength.

Thus, in Example 1 of the present invention, high impurity concentration well regions that are beyond assumption as conventional penetrating wires are used as the power supply wires of the multilayer semiconductor integrated circuit device, and therefore, power supply wires with a sufficient power supply quality can be implemented at a low cost. In the same manner as for TSV, it is not necessary to shift the chips from each other at the time of layering, and it is also unnecessary to insert a TAB or the like between the chips, and therefore, the size can be further reduced three-dimensionally.

Example 2

Figure 11:
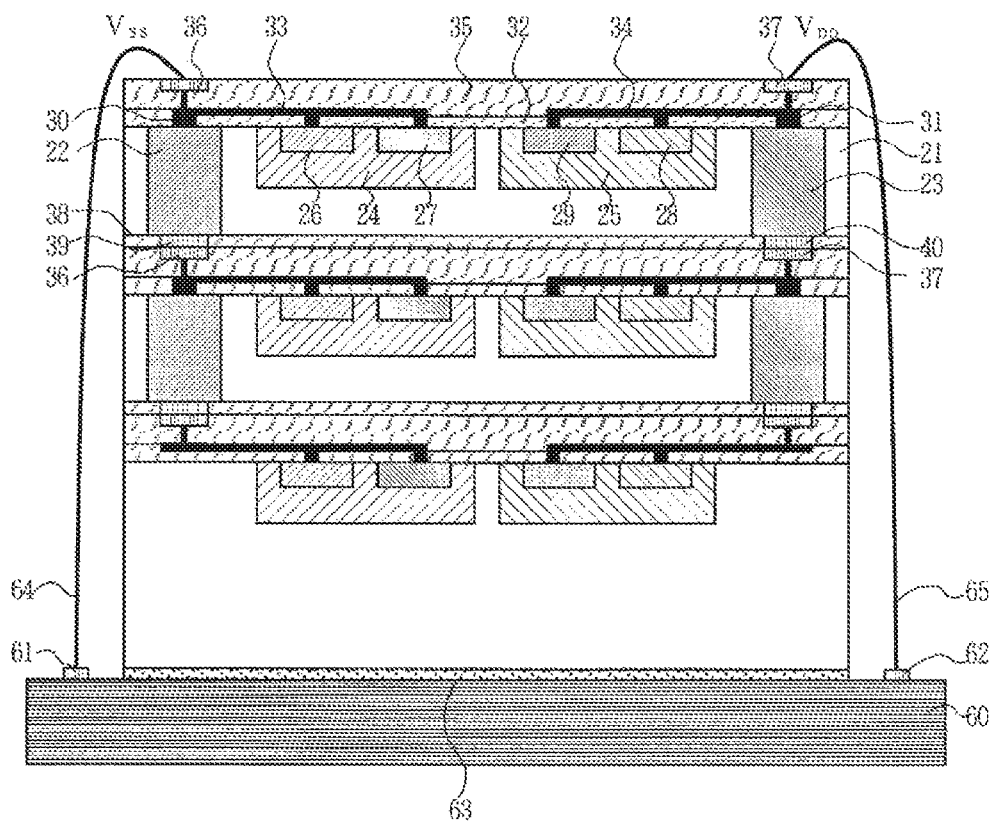
FIG. 11 is a schematic cross-sectional diagram illustrating the multilayer semiconductor integrated circuit device according to Example 2 of the present invention.

Next, the multilayer semiconductor integrated circuit device according to Example 2 of the present invention is described in reference to FIG. 11, which illustrates only the final structure because the basic manufacturing process and the basic structure are the same as in Example 1. FIG. 11 is a schematic cross-sectional diagram illustrating the multilayer semiconductor integrated circuit device according to Example 2 of the present invention, wherein a high impurity well region is not formed in the semiconductor integrated circuit device in the final tier (the third tier at the bottom in the figure), and the rest of the configuration is the same as in Example 1.

Thus, it is not necessary for the chip in the final stage to convey the power supply to the next tier, and therefore, a high impurity well region is not necessary. Accordingly, in the case where chips having different properties are layered on top of each other, the arrangement of a particular chip in the final tier can make it unnecessary for a process of forming a high impurity well region to be carried out for the chip that forms the final tier, and therefore, it is possible to reduce the manufacturing costs.

Example 3

Figure 12:
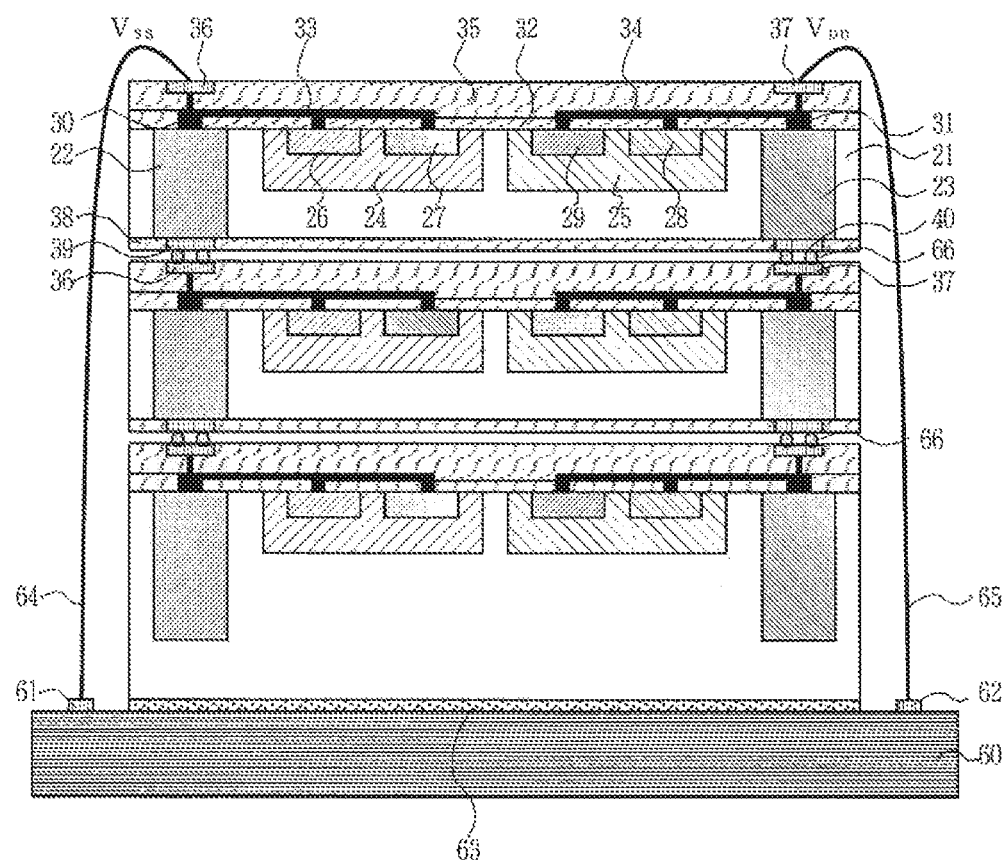
FIG. 12 is a schematic cross-sectional diagram illustrating the multilayer semiconductor integrated circuit device according to Example 3 of the present invention.

Next, the multilayer semiconductor integrated circuit device according to Example 3 of the present invention is described in reference to FIG. 12, which illustrates only the final structure because the basic manufacturing process and the basic structure are the same as in Example 1. FIG. 12 is a schematic cross-sectional diagram illustrating the multilayer semiconductor integrated circuit device according to Example 3 of the present invention, wherein micro-bumps 66 are used for the connection between chips instead of ordinary temperature pressure applying connection, and the rest of the configuration is the same as in Example 1.

Thus, micro-bumps 66 are used for the connection between chips so that the connection between chips can further be made strong electrically and mechanically.

Example 4

Figure 13A:
FIGS. 13A through 13C are diagrams illustrating the multilayer semiconductor integrated circuit device according to Example 4 of the present invention up to a certain step in the manufacturing process.

Next, the multilayer semiconductor integrated circuit device according to Example 4 of the present invention is described in reference to FIGS. 13A through 15G. In Example 4, $p^{++}$ type well regions of the same conductivity type as the $p^-$ type Si substrate 21 are used as the power supply wires for $V_{SS}$ and $V_{DD}$. As illustrated in FIG. 13A, first, B ions with a dosage of $1 \times 10^{16}$ cm$^{-2}$ are implanted into the $p^-$ type Si substrate 21 with an energy for acceleration of 200 keV so as to form $p^{++}$ type well regions 22 and 41 having a size of 0.1 mm×7 mm.

Figure 13B:
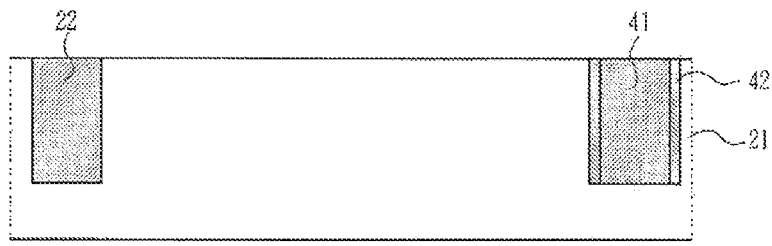

Next, as illustrated in FIG. 13B, P ions with a dosage of $1 \times 10^{16}$ cm$^{-2}$ are implanted with an energy for acceleration of 200 keV so as to form an $n^{++}$ type separation region 42 that surrounds the outside of the $p^{++}$ type well region 41. Next, heat treatment is carried out for 50 hours at 1,050° C. so that the implanted ions are activated, and at the same time diffuse deep in the direction of the thickness of the substrate. Here, the oxide film formed to the surface of the substrate as a result of heat treatment is removed if necessary.

Figure 13C:
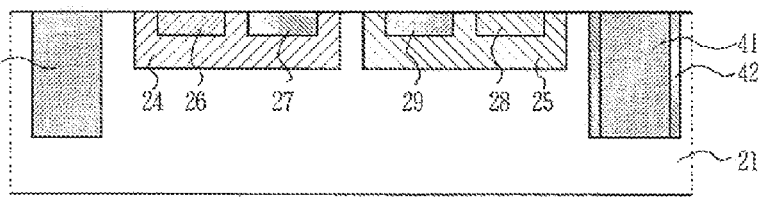

Next, as illustrated in FIG. 13C, a p type well region 24 and an n type well region 25 that become element formation regions are formed in the $p^-$ type Si substrate 21 in accordance with the same manufacturing process as in the prior art. Next, a $p^+$ type substrate contact region 26 is formed in the p type well region 24, and at the same time, an n type region 27 that becomes a source region, a drain region or the like of an n channel MOSFET is formed, and then, a gate electrode (not shown) is provided so that an n channel MOSFET is formed. Meanwhile, an $n^+$ type substrate contact region 28 is formed in the n type well region 25, and at the same time, a p type region 29 that becomes a source region, a drain region or the like is formed, and then, a gate electrode (not shown) is provided so that a p channel MOSFET is formed.

Figure 14D:
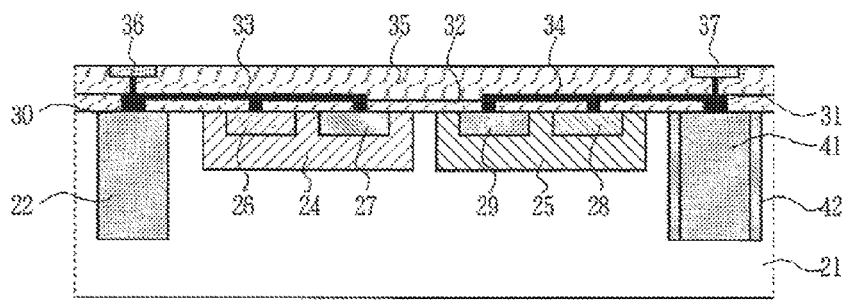
FIGS. 14D through 14F are diagrams illustrating the multilayer semiconductor integrated circuit device according to Example 4 of the present invention in the next step and up to a certain step after the step in FIG. 13C in the manufacturing process.

Next, as illustrated in FIG. 14D, contact electrodes 30 and 31 are formed of Cu on the surface of the $p^{++}$ type well region 22 and the $p^{++}$ type well region 41, and then, a wire layer 33, 34 is formed in accordance with a multilayer wiring technology in the same manner as in Example 1. Next, a front surface electrode 36 is formed of Al or Cu so as to be connected to the contact electrode 30, and a front surface electrode 37 is formed of Al or Cu so as to be connected to the contact electrode 31. At this time as well, coils (not shown) for inductive coupling data communication are formed of multilayer wires. In addition, polishing is carried out in order to flatten the surface. Here, 32 and 35 in the figure are interlayer insulating films made of SiO$_2$.

Figure 14E:
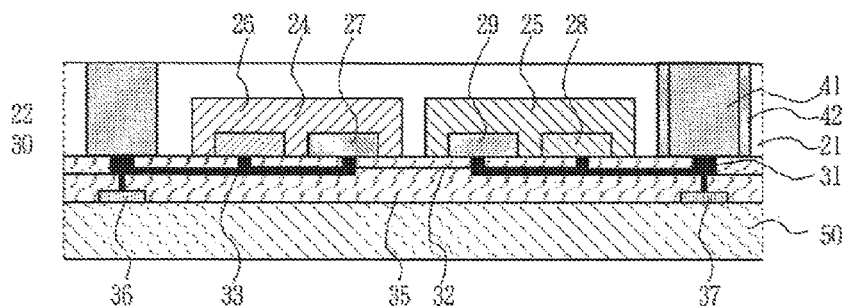

Next, as illustrated in FIG. 14E, the $p^-$ type Si substrate 21 is temporarily joined to a support substrate 50 made of an Si substrate so that the surface on which the front surface electrodes 36 and 37 are formed make contact with the support substrate 50. Next, the $p^-$ type Si substrate 21 is ground to a certain thickness followed by the polishing in accordance with a chemical mechanical polishing method to a thickness of 5 μm.

Figure 14F:
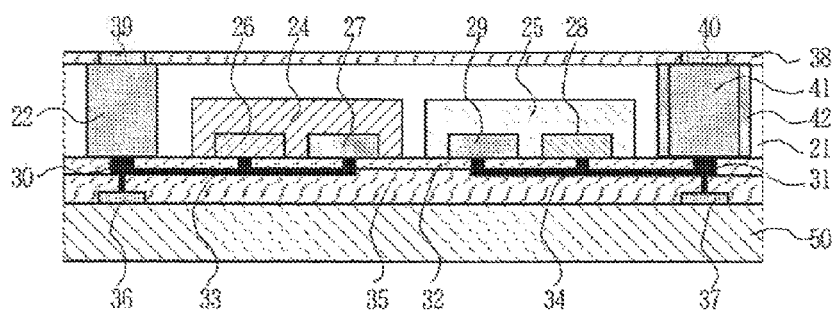
Figure 15G:
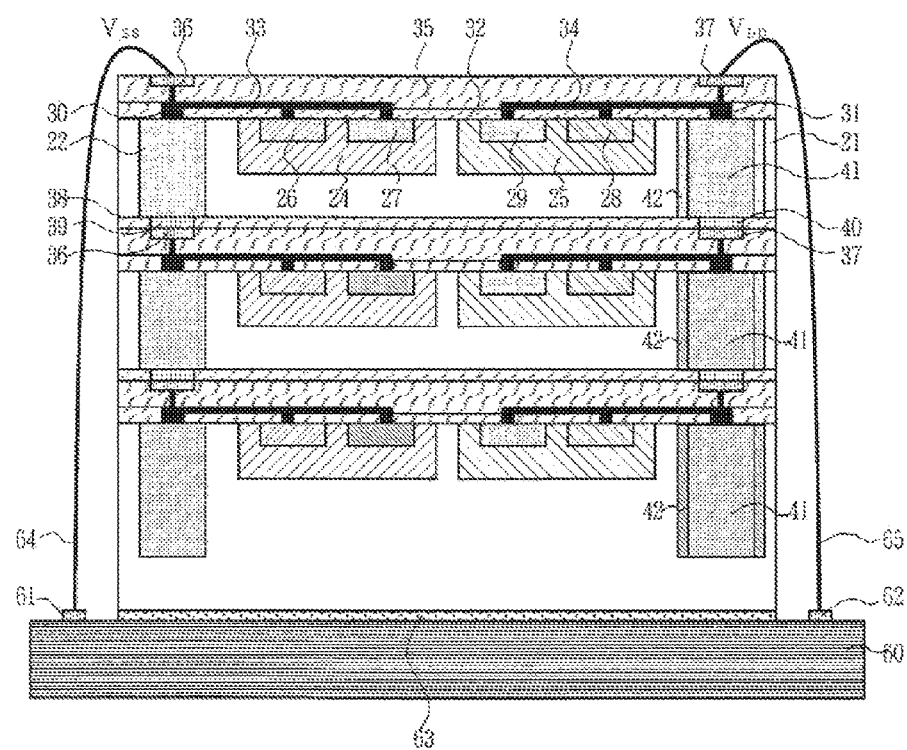
FIG. 15G is a diagram illustrating the multilayer semiconductor integrated circuit device according to Example 4 of the present invention in the next step after the step in FIG. 14F in the manufacturing process.

Next, as illustrated in FIG. 14F, an SiO$_2$ protective film 38 is formed on the polished surface, and after that, openings are created so as to expose the $p^{++}$ type well region 22 and the $p^{++}$ type well region 41, and then, rear surface electrodes 39 and 40 are formed of Al or Cu. At this time as well, polishing is carried out in order to flatten the surface. After that, the same steps as those described in the above in FIGS. 7G through 10K in Example 1 are carried out sequentially so as to gain the final structure in FIG. 15G.

In Example 4, the $p^{++}$ type well region 41 is electrically separated from the $p^-$ type Si substrate by the $n^{++}$ type separation region 42. The $p^{++}$ type well regions 22 and 41, where boron is used to provide a lower resistance up to a location deeper than that where phosphor is used, are used as the power supply wires for $V_{SS}$ and $V_{DD}$, and therefore, the resistance of the power supply wires can be further reduced. Even in the case where the chip is as thick as approximately 6 μm, the same resistance of 3 mΩ can be gained.

Example 5

Figure 16A:
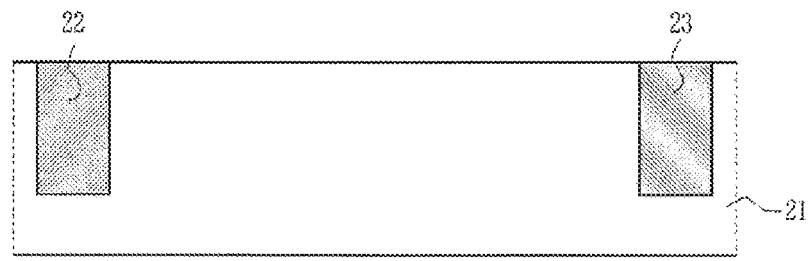
FIGS. 16A through 16C are diagrams illustrating the multilayer semiconductor integrated circuit device according to Example 5 of the present invention up to a certain step in the manufacturing process.
Figure 16B:
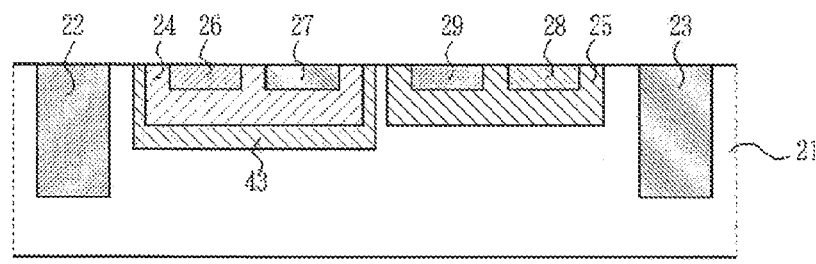

Next, in reference to FIGS. 16A through 18F, the multilayer semiconductor integrated circuit device according to Example 5 of the present invention is described, which has basically the same structure as Example 1, except that the p type well region that is an element formation region is covered with an n type deep well region in Example 5. As illustrated in FIG. 16A, first, B ions with a dosage of $1 \times 10^{16}$ cm$^{-2}$ are implanted into a $p^-$ type Si substrate 21 with an energy for acceleration of 200 keV so as to form a $p^{++}$ type well region 22 having a size of 0.1 mm×7 mm, and then, P ions with a dosage of $1 \times 10$ cm$^{-2}$ are implanted into the $p^-$ type Si substrate 21 with an energy for acceleration of 200 keV so as to form an $n^{++}$ type well region 23 having a size of 0.1 mm×7 mm in the same manner as in Example 1. Next, heat treatment is carried out for 50 hours at 1,050° C. so that the implanted ions are activated, and at the same time are diffused deeper in the direction of the thickness of the substrate. Here, the oxide film formed on the surface of the substrate as a result of heat treatment is removed if necessary.

Figure 16C:
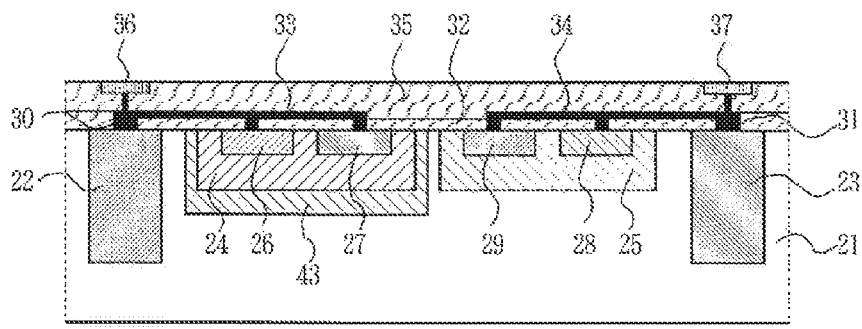

Next, as illustrated in FIG. 16C, a p type well region 24 and an n type well region 25 that become element formation regions are formed in the $p^-$ type Si substrate 21 in accordance with the same manufacturing process as in the prior art. Here, an n type deep well region 43 that surrounds the p type well region 24 is formed in advance so that the p type well region 24 is electrically separated from the $p^-$ type Si substrate 21. Next, a $p^+$ type substrate contact region 26 is formed in the p type well region 24, and a gate electrode (not shown) is provided so that an n channel MOSFET is formed. Meanwhile, an $n^+$ type substrate contact region 28 is formed in the n type well region 25, and at the same time, a p type region 29 that becomes a source region, a drain region or the like is formed, and then, a gate electrode (not shown) is provided so that a p channel MOSFET is formed.

Next, as illustrated in FIG. 16C, contact electrodes 30 and 31 are formed of Cu on the surface of the $p^{++}$ type well region 22 and the $p^{++}$ type well region 41, and then, a wire layer 33, 34 is formed in accordance with a multilayer wiring technology. Next, a front surface electrode 36 is formed of Al or Cu so as to be connected to the contact electrode 30, and a front surface electrode 37 is formed of Al or Cu so as to be connected to the contact electrode 31. At this time as well, coils (not shown) for inductive coupling data communication are formed of multilayer wires. In addition, polishing is carried out in order to flatten the surface. Here, 32 and 35 in the figure are interlayer insulating films made of SiO$_2$.

Figure 17D:
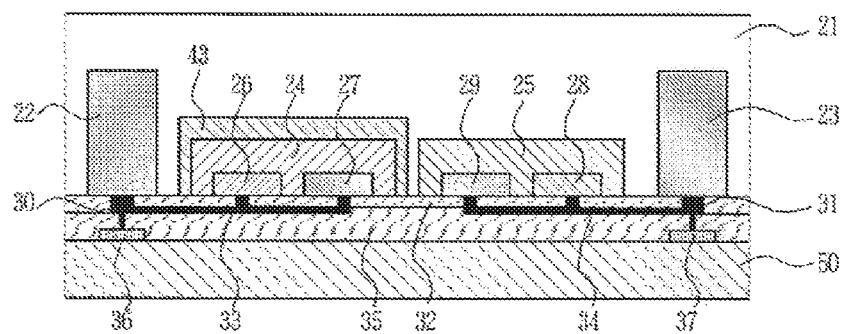
FIGS. 17D and 17E are diagrams illustrating the multilayer semiconductor integrated circuit device according to Example 5 of the present invention in the next step and up to a certain step after the step in FIG. 16C in the manufacturing process.
Figure 17E:
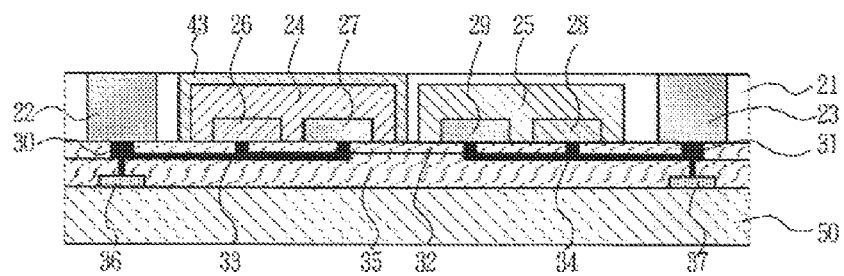
Figure 18F:
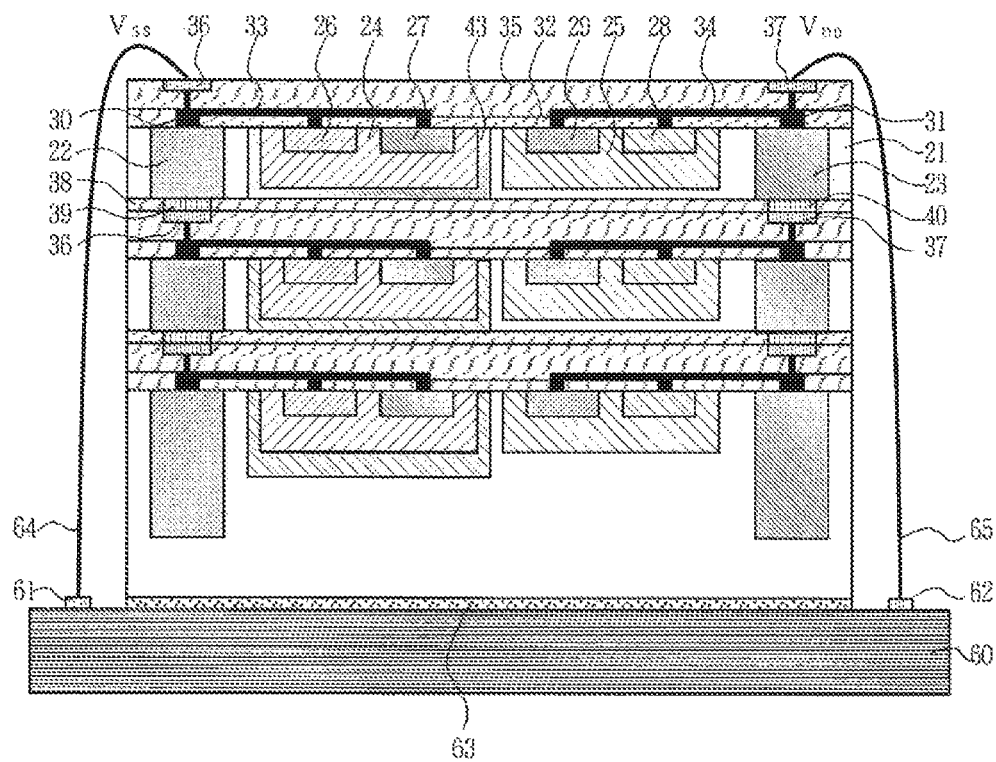
FIG. 18F is a diagram illustrating the multilayer semiconductor integrated circuit device according to Example 5 of the present invention in the next step after the step in FIG. 17E in the manufacturing process.

Next, as illustrated in FIG. 17D, the p⁻ type Si substrate 21 is temporarily joined to a support substrate 50 made of an Si substrate so that the surface on which the front surface electrodes 36 and 37 are formed make contact with the support substrate 50. Next, as illustrated in FIG. 17E, the p⁻ type Si substrate 21 is ground to a certain thickness followed by the polishing in accordance with a chemical mechanical polishing method to a thickness of 3 µm. At this time, the bottom of the n type deep well region 43 is exposed from the polished surface. After that, the same steps as those described above in FIGS. 7F through 10K in Example 1 are carried out sequentially so that the final structure in FIG. 18F is gained.

In Example 5, though the p⁻ type Si substrate 21 is polished so as to be thin enough that the bottom of the n type deep well region 43 is exposed from the polished surface, the p type well region 24 that is an element formation region is not exposed directly, and therefore, the element properties are microscopically affected.

Example 6

Figure 19:
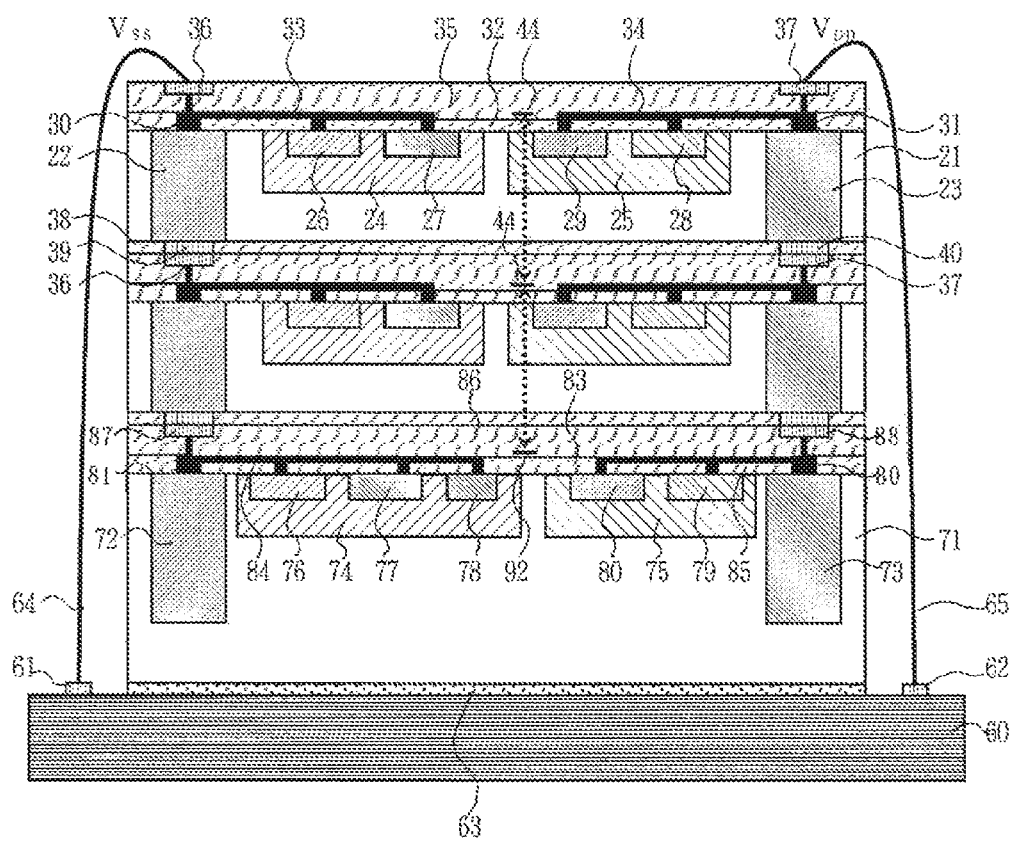
FIG. 19 is a schematic cross-sectional diagram illustrating the multilayer semiconductor integrated circuit device according to Example 6 of the present invention.

Next, in reference to FIG. 19, the multilayer semiconductor integrated circuit device according to Example 6 of the present invention is described. Example 6 is the same as Example 1, except that the type of semiconductor integrated circuit devices that are layered on top of each other in Example 6 is different from that in Example 1, and therefore, only the final structure is described. FIG. 19 is a schematic cross-sectional diagram illustrating the multilayer semiconductor integrated circuit device according to Example 6 of the present invention, wherein a controller chip that is different from the memory chips in the first and second tiers is layered in the third tier in the above-described step in FIG. 9J.

In this case, the controller chip has a p⁺⁺ type well region 72 provided in the p⁻ type Si substrate 71 in the same location as that of the p⁺⁺ type well region 22 provided in the memory chips and has an n⁺⁺ type well region 73 provided in the same location as that of the n⁺⁺ type well region 23. Next, a p type well region 74 and an n type well region 75 that become element formation regions are formed in the p⁻ type Si substrate 71. Next, a p⁺ type substrate contact region 76 is formed in the p type well region 74, and at the same time, n type regions 77 and 78 that become a source region, a drain region or the like are formed, and then, a gate electrode (not shown) is provided so that an n channel MOSFET is formed. Meanwhile, an n⁺ type substrate contact region 79 is formed in the n type well region 75, and at the same time, a p type region 80 that becomes a source region, a drain region or the like is formed, and then, a gate electrode (not shown) is provided so that a p channel MOSFET is formed.

Next, contact electrodes 81 and 82 are formed of Cu on the surface of the p⁺⁺ type well region 72 and the n⁺⁺ type well region 73, and then, a wire layer 84, 85 is formed in accordance with a multilayer wiring technology. Next, a front surface electrode 87 is formed of Al or Cu so as to be connected to the contact electrode 81, and a front surface electrode 88 is formed of Al or Cu so as to be connected to the contact electrode 82.

At this time, a coil for inductive coupling data communication 92 is formed of multilayer wires in the same location as coils for communication 44 that are provided in the memory chips when the chips are layered on top of each other. In addition, polishing is carried out in order to flatten the surface. Here, 83 and 86 in the figure are interlayer insulating films made of $SiO_2$.

Next, the rear surface of the p⁻ type Si substrate 71 that forms a controller chip is fixed to the top of a package substrate 60 by means of an adhesive 63. Next, a power supply pad 61 to which $V_{SS}$ is to be applied and the front surface electrode 36 that is connected to the p⁺⁺ type well region 22 are connected through a bonding wire 64. Meanwhile, a power supply pad 62 to which $V_{DD}$ is to be applied and the front surface electrode 37 that is connected to the n⁺⁺ type well region 23 are connected through a bonding wire 65, and thus, the basic structure of the multilayer semiconductor integrated circuit device according to Example 6 of the present invention is complete.

Thus, a technology of making layers thinner and a multilayer technology are combined for use in Example 6 of the present invention so as to make it possible to implement a compact semiconductor memory device where memory chips and a controller chip that drives and controls the memory chips are layered on top of each other at a low cost.

Example 7

Figure 20A:
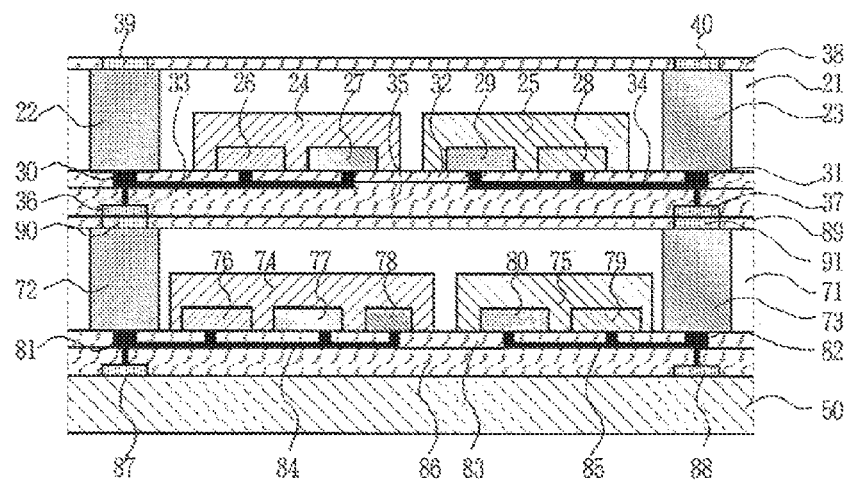
FIGS. 20A and 20B are diagrams illustrating the multilayer semiconductor integrated circuit device according to Example 7 of the present invention up to a certain step in the manufacturing process.

Next, in reference to FIGS. 20A through 22D, the multilayer semiconductor integrated circuit device according to Example 7 of the present invention is described. In Example 7, a compact solid state imaging device is implemented by achieving metal connection between rear surface electrodes. As illustrated in FIG. 20A, first, a memory chip is layered on top of a controller chip so as to form a multilayer body with the thickness of the layers being reduced. Though this is a combination of a controller chip and a memory chip, the process of making the layers thinner and the multilayer process are the same as the processes with the steps in FIGS. 5A through 8I.

Figure 20B:
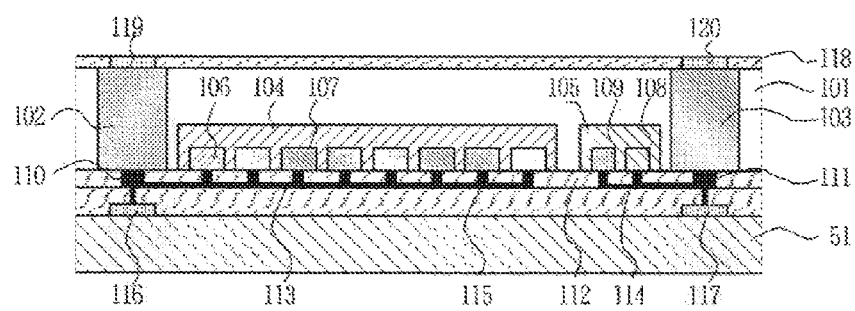

Meanwhile, as illustrated in FIG. 20B, an image sensor chip has a p⁺⁺ type region 102 provided in a p⁻ type Si substrate 101 in the same location as that of the p⁺⁺ type well region 22 provided in the memory chip and has an n⁺⁺ type well region 103 provided in the same location as that of the n⁺⁺ type well region 23. Next, a p type well region 104 and an n type well region 105 that become element formation regions are formed in the p⁻ type Si substrate 101. Next, a p⁺ type substrate contact region 106 is formed in the p type well region 104, and at the same time, n type regions 107 that become pixel elements are formed in a matrix. Meanwhile, an n⁺ type substrate contact region 108 is formed in the n type well region 105, and at the same time, a p type region 109 that becomes a source region, a drain region or the like is formed, and then, a gate electrode (not shown) is provided so that a p channel MOSFET is formed.

Next, contact electrodes 110 and 111 are formed of Cu on the surface of the p⁺⁺ type well region 102 and the n⁺⁺ type well region 103, and then, a wire layer 113, 114 is formed in accordance with a multilayer wiring technology. Next, a front surface electrode 116 is formed of Al or Cu so as to be connected to the contact electrode 110, and a front surface electrode 117 is formed of Al or Cu so as to be connected to the contact electrode 111. At this time, coils for inductive coupling data communication are formed of multilayer wires. In addition, polishing is carried out in order to flatten the surface. Here, 112 and 115 in the figure are interlayer insulating films made of $SiO_2$.

Next, the image sensor chip is fixed to a support substrate 51 and the thickness is reduced. After an $SiO_2$ protective film 118 has been formed on the polished surface, openings are created so as to expose the p⁺⁺ type well region 102 and the p$^{++}$ type well region 103, and then, rear surface electrodes 119 and 120 are formed of Al or Cu. At this time as well, polishing is carried out in order to flatten the surface.

Figure 21C:
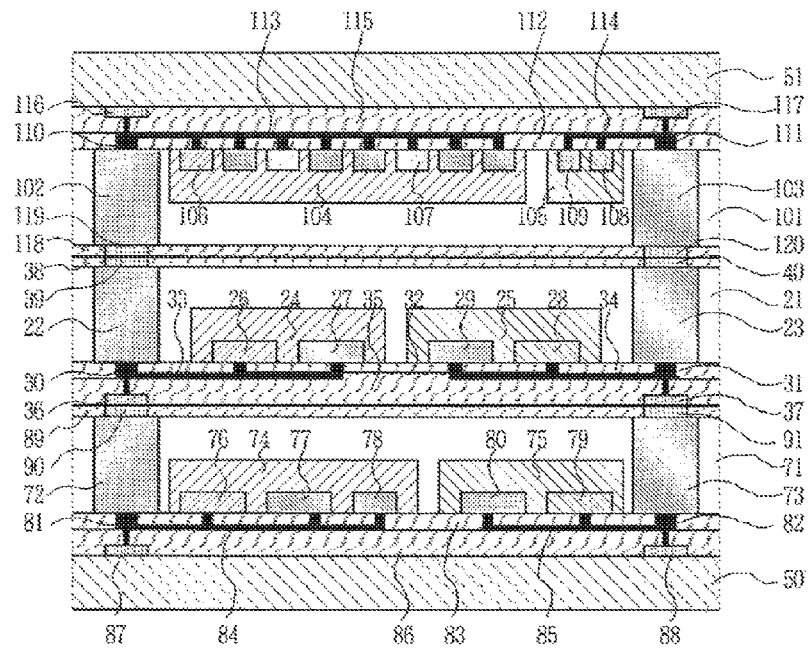
FIG. 21C is a diagram illustrating the multilayer semiconductor integrated circuit device according to Example 7 of the present invention in the next step and up to a certain step after the step in FIG. 20B in the manufacturing process.

Next, as illustrated in FIG. 21C, the chips are layered on top of each other in such a manner that the rear surface electrodes 39 and 40 of the memory chip make contact with the rear surface electrodes 119 and 120, respectively. At this time, the electrodes are joined through ordinary temperature pressure applying connection after the surface of the metal has been activated, that is to say, through solid phase connection by means of the diffusion between metal surfaces.

Figure 22D:
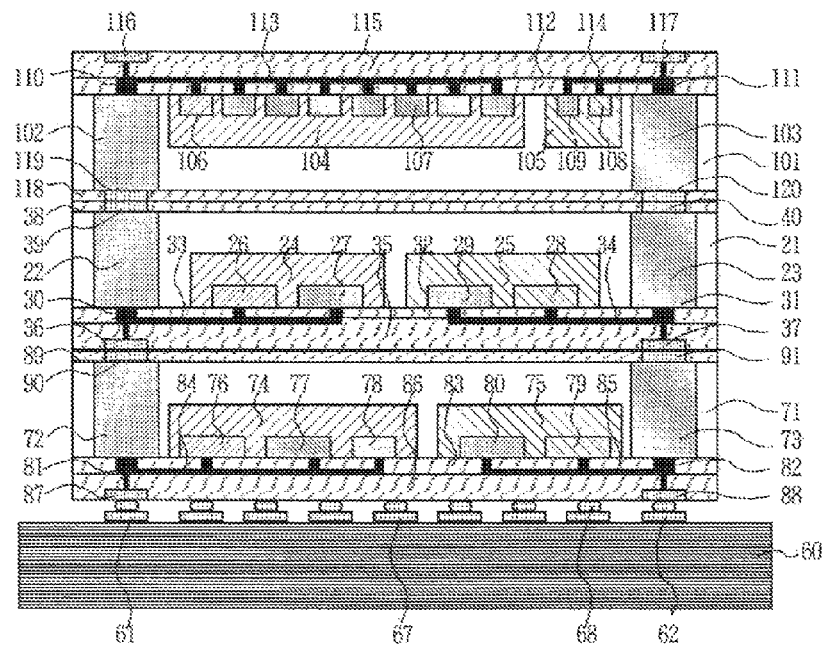
FIG. 22D is a diagram illustrating the multilayer semiconductor integrated circuit device according to Example 7 of the present invention in the next step after the step in FIG. 21C in the manufacturing process.

Next, as illustrated in FIG. 22D, the layered wafers are removed from the support substrates 50 and 51 and divided into chips of a predetermined size, and after that, the controller chip is layered on top of the package substrate 60 in such a manner that the front surface electrodes 87 and 88 are deposited onto the power supply pads 61 and 62, respectively, through bumps 68, and thus, the basic structure of the multilayer semiconductor integrated circuit device according to Example 7 of the present invention is complete. At this time, the space between the package substrate 60 and the controller chip is filled in with an underfill resin. Here, 67 in the figure is a signal pad that is connected to a pad (not shown) provided on the front surface of the controller chip through a bump 68.

In Example 7 of the present invention, an image sensor that has been formed in a separate process is integrated with another chip through the metal connection between the rear surface electrodes after the thickness of the image sensor has been reduced, and therefore, the chips can be layered in such a manner that the surface on which pixels are formed so as to provide an imaging surface becomes the front surface, and in addition, the thickness has been reduced, which makes the transmission and reception of the signals between chips possible through inductive coupling data communication. In addition, a memory chip is integrated, and at the same time, a high performance controller chip is also layered and integrated, and therefore, it is possible to implement a compact high performance imaging device at a low cost.

Example 8

Figure 23A:
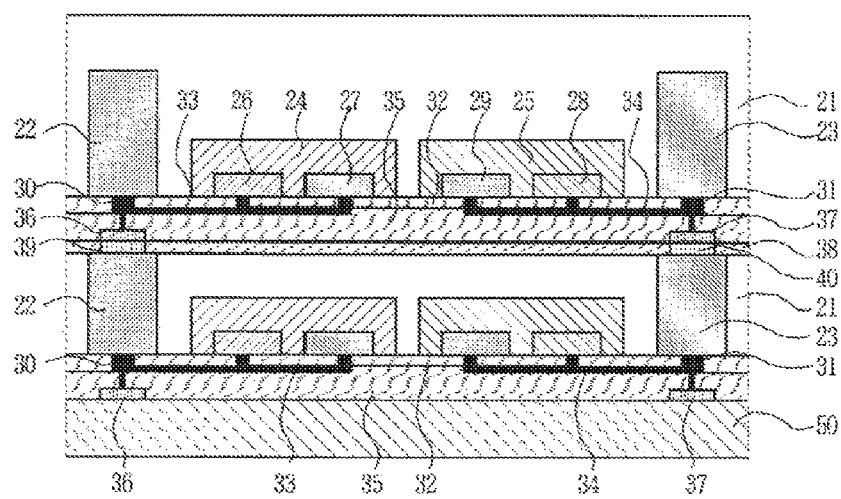
FIGS. 23A and 23B are diagrams illustrating the multilayer semiconductor integrated circuit device according to Example 8 of the present invention up to a certain step in the manufacturing process.

Next, in reference to FIGS. 23A through 25D, the multilayer semiconductor integrated circuit device according to Example 8 of the present invention is described. In Example 8, a semiconductor memory device having the same functions as the semiconductor memory device according to Example 6 is formed without using wire bonding. First, as illustrated in FIG. 23A, a multilayer body where two memory chips are layered on top of each other is formed in the same manner as in the above-described steps in FIGS. 5A through 7G.

Figure 23B:
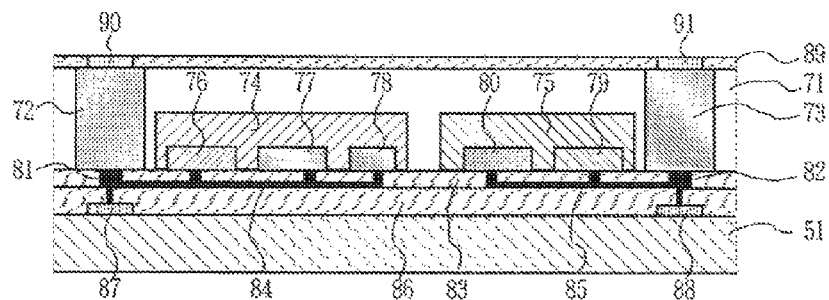

Meanwhile, as illustrated in FIG. 23B, a controller chip is fixed to a support substrate 51 and the thickness is reduced, and after that, rear surface electrodes 90 and 91 are formed. Here, the element structure of the controller chip is the same as that of the controller chip in FIG. 19.

Figure 24C:
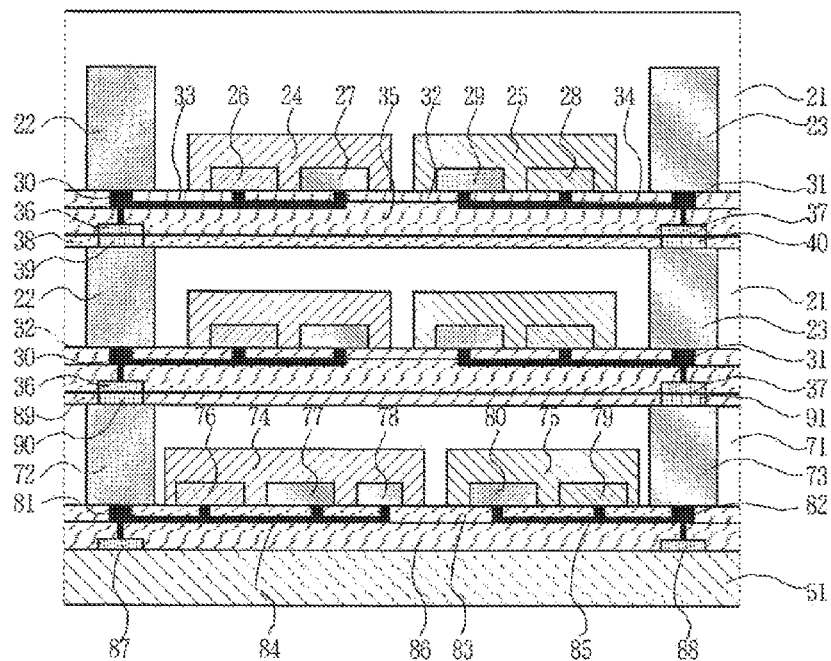
FIG. 24C is a diagram illustrating the multilayer semiconductor integrated circuit device according to Example 8 of the present invention in the next step and up to a certain step after the step in FIG. 23B in the manufacturing process.

Next, as illustrated in FIG. 24C, the support substrate 50 is removed, and the controller chip and the memory chip are layered in such a manner that the rear surface electrodes 90 and 91 of the controller chip make contact with the front surface electrodes 36 and 37 of the memory chip, respectively. In this case, the p$^-$ type Si substrate 21 is sufficiently thick, and therefore, the chips can be layered on top of each other after the support substrate 50 has been removed. At this time, the electrodes are joined through ordinary temperature pressure applying connection after the surface of the metal has been activated, that is to say, through solid phase connection by means of the diffusion between metal surfaces.

Figure 25D:
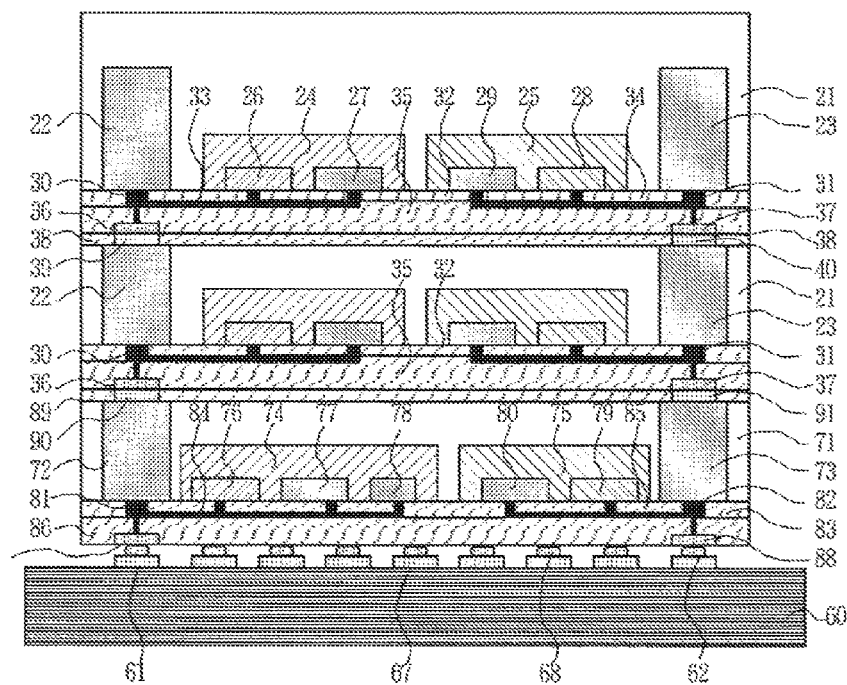
FIG. 25D is a diagram illustrating the multilayer semiconductor integrated circuit device according to Example 8 of the present invention in the next step after the step in FIG. 24C in the manufacturing process.

Next, as illustrated in FIG. 25D, the layered wafers are removed from the support substrate 51 and divided into chips of a predetermined size, and after that, the controller chip is layered on top of the package substrate 60 in such a manner that the front surface electrodes 87 and 88 are deposited onto the power supply pads 61 and 62, respectively, through bumps 68, and thus, the basic structure of the multilayer semiconductor integrated circuit device according to Example 8 of the present invention is complete. At this time, the space between the package substrate 60 and the controller chip is filled in with an underfill resin. Here, 67 in the figure is a signal pad that is connected to a pad (not shown) provided on the front surface of the controller chip through a bump 68.

In Example 8 of the present invention, the controller chip is electrically connected to the package substrate through pads without using any bonding wires, and therefore, the space for providing bonding wires becomes unnecessary, which can save more space.

Example 9

Figure 26:
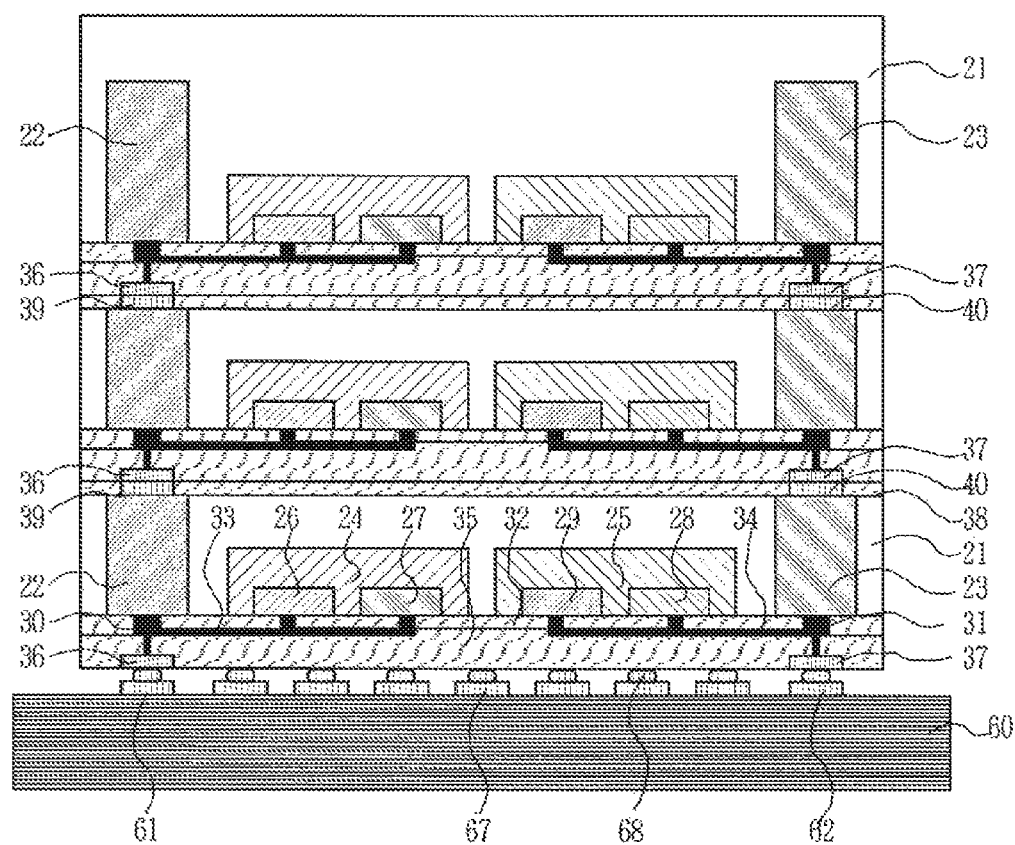
FIG. 26 is a schematic cross-sectional diagram illustrating the multilayer semiconductor integrated circuit device according to Example 9 of the present invention.

Next, in reference to FIG. 26, the multilayer semiconductor integrated circuit device according to Example 9 of the present invention is described. In Example 9, a memory device having the same functions as the memory device according to Example 1 is formed without using wire bonding. As illustrated in FIG. 26, a multilayer body where three memory chips are layered on top of each other is formed in the same manner as in the above-described steps in FIGS. 5A through 9J.

Next, the multilayered wafers are removed from the support substrate and divided into chips of a predetermined size, and then, the memory chip is layered on the package substrate 60 in such a manner that the front surface electrodes 36 and 37 are deposited onto the power supply pads 61 and 62, respectively, through bumps 68, and thus, the basic structure of the multilayer semiconductor integrated circuit device according to Example 9 of the present invention is complete. At this time, the space between the package substrate 60 and the controller chip is filled in with an underfill resin. Here, 67 in the figure is a signal pad that is connected to a pad (not shown) provided on the front surface of the memory chip through a bump 68.

In Example 9 of the present invention, the memory chip is electrically connected to the package substrate through pads without using any bonding wires, and therefore, the space for providing bonding wires becomes unnecessary, which can save more space.

Example 10

Figure 27:
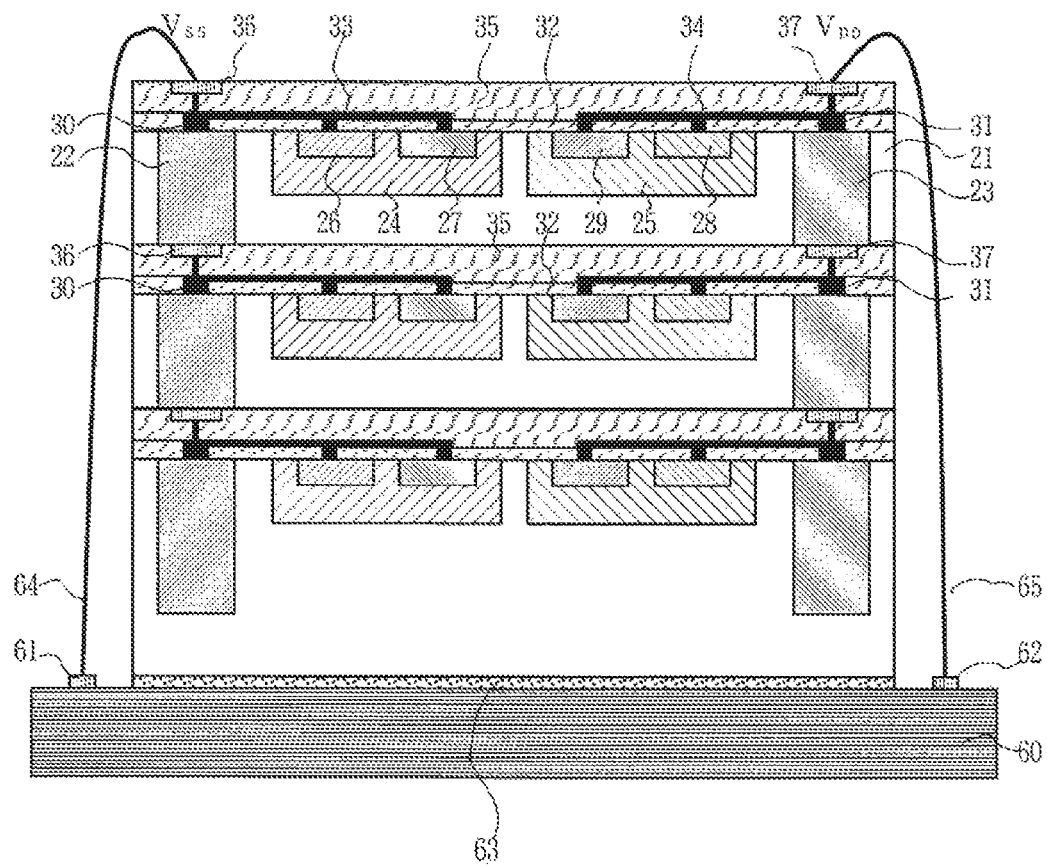
FIG. 27 is a schematic cross-sectional diagram illustrating the multilayer semiconductor integrated circuit device according to Example 10 of the present invention.

Next, in reference to FIG. 27, the multilayer semiconductor integrated circuit device according to Example 10 of the present invention is described. Example 10 is the same as Example 1, except that the p$^{++}$ type well region 22 and the front surface electrode 36 are directly connected to each other without providing a rear surface electrode, and the n$^{++}$ type well region 23 and the front surface electrode 37 are also directly connected to each other without providing a rear surface electrode. FIG. 27 is a schematic cross-sectional diagram illustrating the multilayer semiconductor integrated circuit device according to Example 10 of the present invention, where the thickness of the chip in the first tier is reduced, and after that, the chip in the second tier is layered and joined to the chip in the first tier, and then, the thickness of the chip in the second tier is reduced, and after that, the chip in the third tier is layered and joined to the chip in the second tier.

In this case, pressure is applied at ordinary temperature in a state where the chips are layered on top of each other so that solid phase connection occurs between the silicon oxide films by means of the diffusion or solid phase connection occurs between silicon and the silicon oxide film by means of the diffusion, and as a result, the front surface electrode of one chip is electrically connected to the high impurity concentration well region of the other chip through contact bonding.

Next, the layered wafers are removed from the support substrate and divided into chips of a predetermined size, and after that, each chip is fixed to a package substrate 60 by means of an adhesive 63. Next, the power supply pad 61 to which $V_{SS}$ is to be applied is connected to the front surface electrode 36 connected to the $p^{++}$ type well region 22 by means of a bonding wire 64. Meanwhile, the power supply pad 62 to which $V_{DD}$ is to be applied is connected to the front surface electrode 37 connected to the $n^{++}$ type well region 23 by means of a bonding wire 65, and thus, the basic structure of the multilayer semiconductor integrated circuit device according to Example 10 of the present invention is complete.

In Example 10 of the present invention, the rear surface electrodes are omitted, which makes it possible to reduce the manufacturing costs, and at the same time makes it possible to reduce the height of the multilayer structure.

Example 11

Figure 28A:
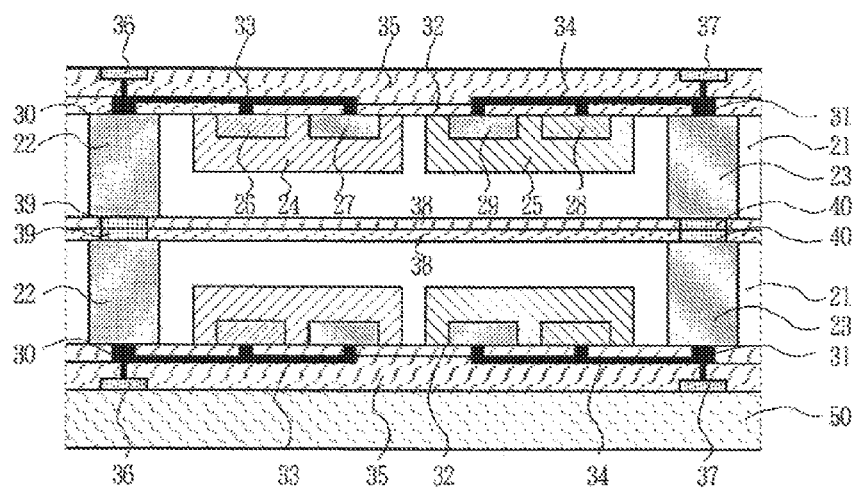
FIGS. 28A and 28B are diagrams illustrating the multilayer semiconductor integrated circuit device according to Example 11 of the present invention up to a certain step in the manufacturing process.

Next, in reference to FIGS. 28A through 30D, the multilayer semiconductor integrated circuit device according to Example 11 of the present invention is described. In Example 11, a semiconductor memory device having the same functions as the semiconductor memory device according to Example 8 is formed by using connections between the front surface electrodes. First, as illustrated in FIG. 28A, two memory chips on which rear surface electrodes have been formed are joined together so that the rear surface electrodes are joined together after the thickness of the memory chips has been reduced. That is to say, two memory chips that have been formed in the same manner as in the above-described steps in FIGS. 5A through 7F are layered on top of each other with the rear surfaces facing each other.

Figure 28B:
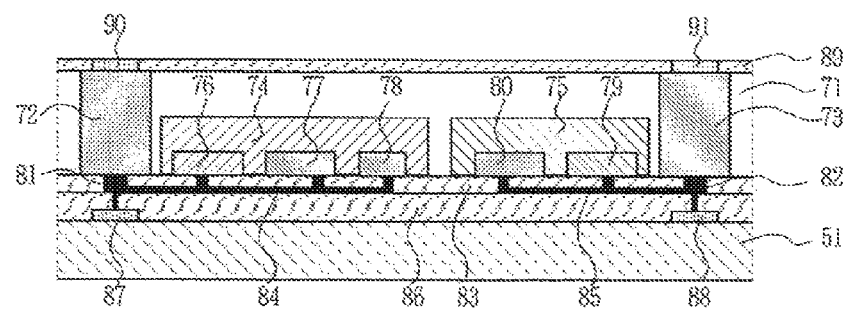

Meanwhile, as illustrated in FIG. 28B, a controller chip is fixed to a support substrate 51, and then, rear surface electrodes 90 and 91 are formed after the thickness of the controller chip has been reduced. Here, the element structure of the controller chip is the same as that in FIG. 19.

Figure 29C:
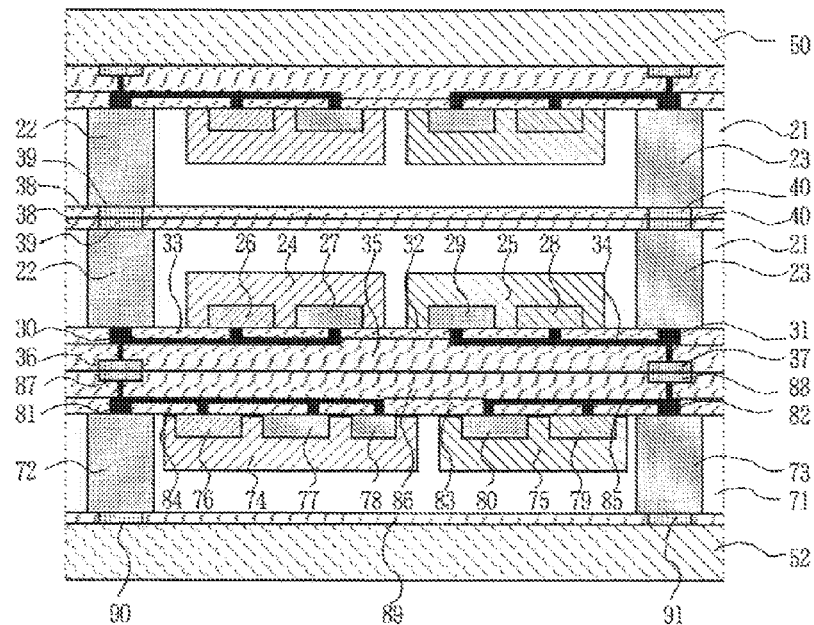
FIG. 29C is a diagram illustrating the multilayer semiconductor integrated circuit device according to Example 11 of the present invention in the next step and up to a certain step after the step in FIG. 28B in the manufacturing process.

Next, as illustrated in FIG. 29C, the rear surface electrodes 90 and 91 of the controller chip are fixed to a support substrate 52 made of a new silicon substrate. Next, the controller chip and the memory chip are layered in such a manner that the front surface electrodes 87 and 88 of the controller chip make contact with the front surface electrode 36 and 37 of the memory chip, respectively. At this time, the electrodes are joined through ordinary temperature pressure applying connection after the surface of the metal has been activated, that is to say, through solid phase connection by means of the diffusion between metal surfaces.

Figure 30D:
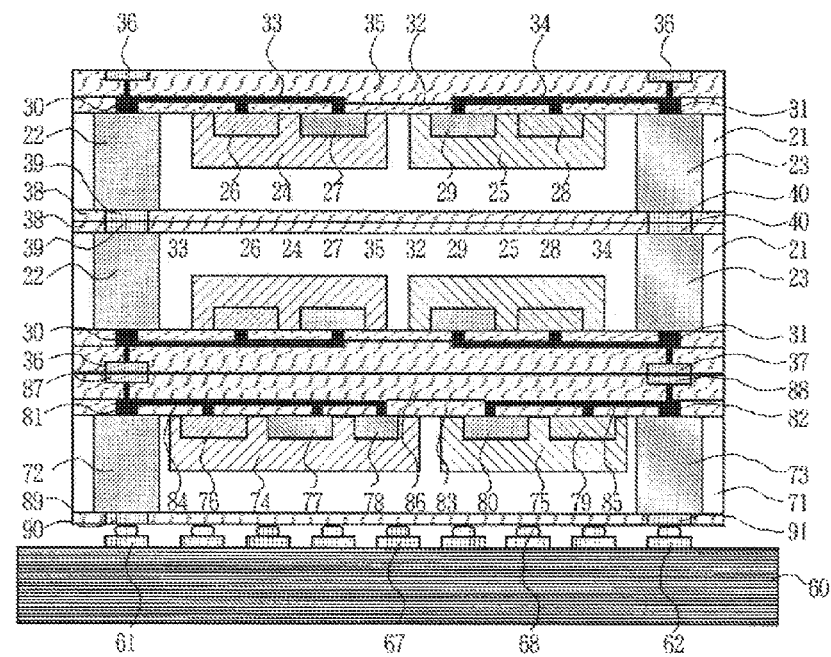
FIG. 30D is a diagram illustrating the multilayer semiconductor integrated circuit device according to Example 11 of the present invention in the next step after the step in FIG. 29C in the manufacturing process.

Next, as illustrated in FIG. 30D, the multilayered wafers are removed from the support substrates 50 and 52 and divided into chips of a predetermined size, and then, the controller chip is layered on the package substrate 60 in such a manner that the front surface electrodes 87 and 88 are deposited onto the power supply pads 61 and 62, respectively, through bumps 68, and thus, the basic structure of the multilayer semiconductor integrated circuit device according to Example 11 of the present invention is complete. At this time, the space between the package substrate 60 and the controller chip is filled in with an underfill resin. Here, 67 in the figure is a signal pad that is connected to a pad (not shown) provided on the front surface of the controller chip through a bump 68.

In Example 11 of the present invention, the controller chip is electrically connected to the package substrate through pads without using any bonding wires, and therefore, the space for providing bonding wires becomes unnecessary, which can save more space. In addition, the distance between the coils for communication provided in the controller chip and the memory chip becomes shorter by the thickness of the controller chip, and therefore, it is possible to save on the power for inductive coupling data communication.

Example 12

Figure 31:
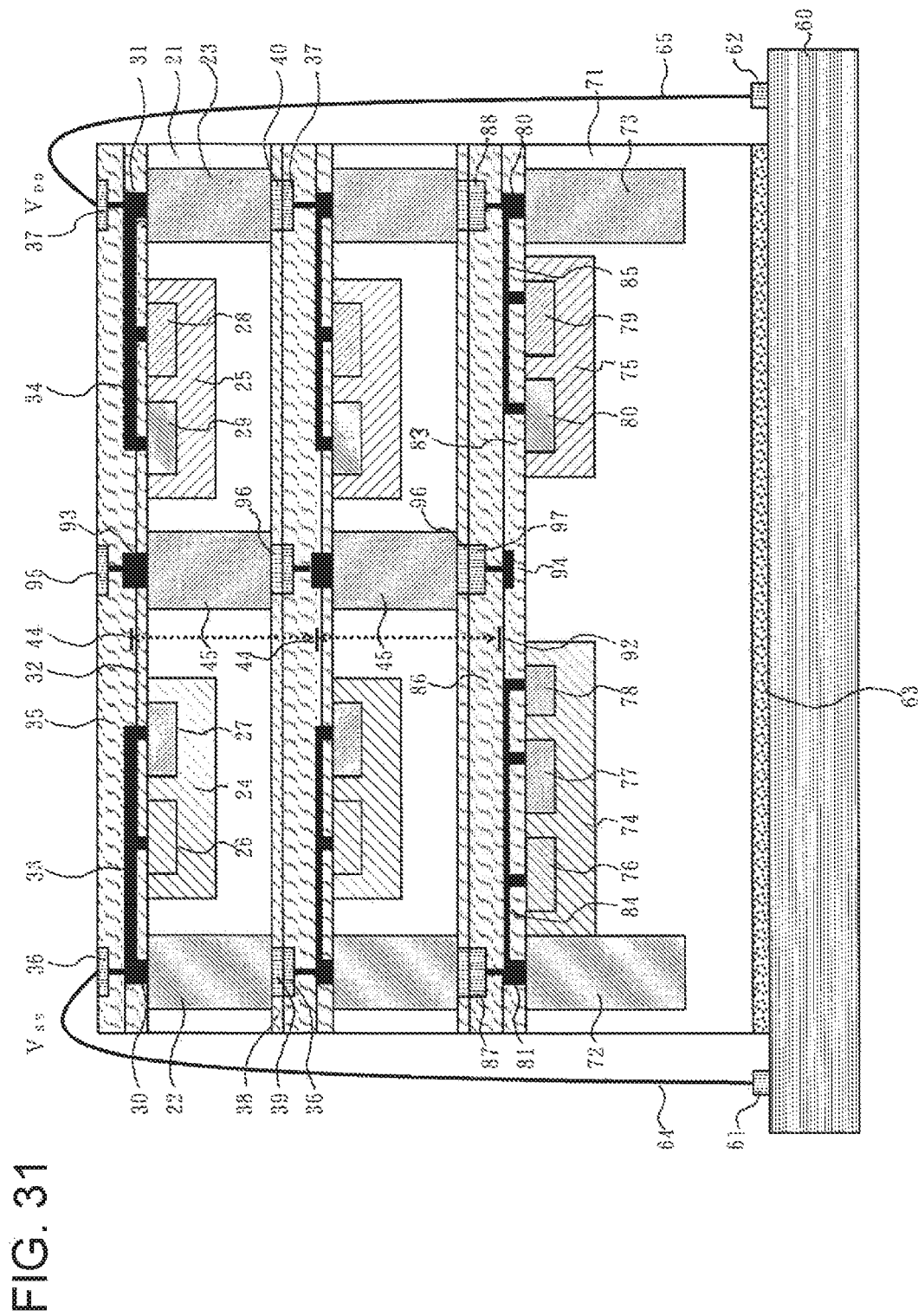
FIG. 31 is a schematic cross-sectional diagram illustrating the multilayer semiconductor integrated circuit device according to Example 12 of the present invention.

Next, in reference to FIG. 31, the multilayer semiconductor integrated circuit device according to Example 12 of the present invention is described. In Example 12, penetrating semiconductor regions are provided as signal wires for a chip selection signal, and the rest of the structure is the same as that in Example 6, and therefore, only the final structure is described. FIG. 31 is a schematic cross-sectional diagram illustrating the multilayer semiconductor integrated circuit device according to Example 12 of the present invention, where $n^{++}$ type well regions 45 are additionally and respectively provided in the $p^-$ type Si substrates 21 and 71 in the memory chips in the first and second tiers in FIG. 19 as a signal wire for a chip selection signal. A contact electrode 93 and a front surface electrode 95 made of Al or Cu are provided so as to be connected to the $n^{++}$ type well regions 45. In addition, a rear surface electrode 96 made of Al or Cu is provided on the rear surface side so as to be connected to the $n^{++}$ type well regions 45.

A contact electrode 94 and a front surface electrode 97 made of Al or Cu are provided in the controller chip in the third tier so as to be connected to the chip selection signal wire (not shown). In this case as well, a coil for inductive coupling data communication 92 is formed of multilayer wires in the same location as the coil for communication 44 provided in the memory chip when the chips are layered on top of each other. In addition, polishing is carried out in order to flatten the surface. Here, 83 and 86 in the figure are interlayer insulating films made of $SiO_2$.

Next, the controller chip is secured onto the package substrate 60 by means of an adhesive 63 through the rear surface of the $p^-$ type Si substrate 71 that forms the controller chip. Next, the power supply pad 61 to which $V_{SS}$ is to be applied and the front surface electrode 36 connected to the $p^{++}$ type well region 22 are connected by means of a bonding wire 64. Meanwhile, the power supply pad 62 to which $V_{DD}$ is to be applied and the front surface electrode 37 connected to the $n^{++}$ type well region 23 are connected by means of a bonding wire 65, and thus, the basic structure of the multilayer semiconductor integrated circuit device according to Example 12 of the present invention is complete.

Though in Example 12 of the present invention the n$^{++}$ type well regions 45 are used as wires for a chip selection signal, which is a low speed signal of 10 MHz or less, the number of wires is small, which makes the arrangement possible in terms of the area. In addition, the frequency of the signal that can pass through is generally determined by the inverse of the CR time constant that is determined by the product of the resistance and the capacitance, and therefore, penetrating semiconductor regions having approximately the same cross-sectional area for a TSV can provide a wire for a signal of which the level is approximately 1/400 of a conventional signal that can pass through the power supply TSV. Here, in the case of a memory, a conventional signal is of several hundred MHz, and therefore, a signal of approximately 10 MHz or less can be allowed to pass by using a cross-sectional area that is several times or fewer greater than that of a TSV.

Example 13

Figure 32:
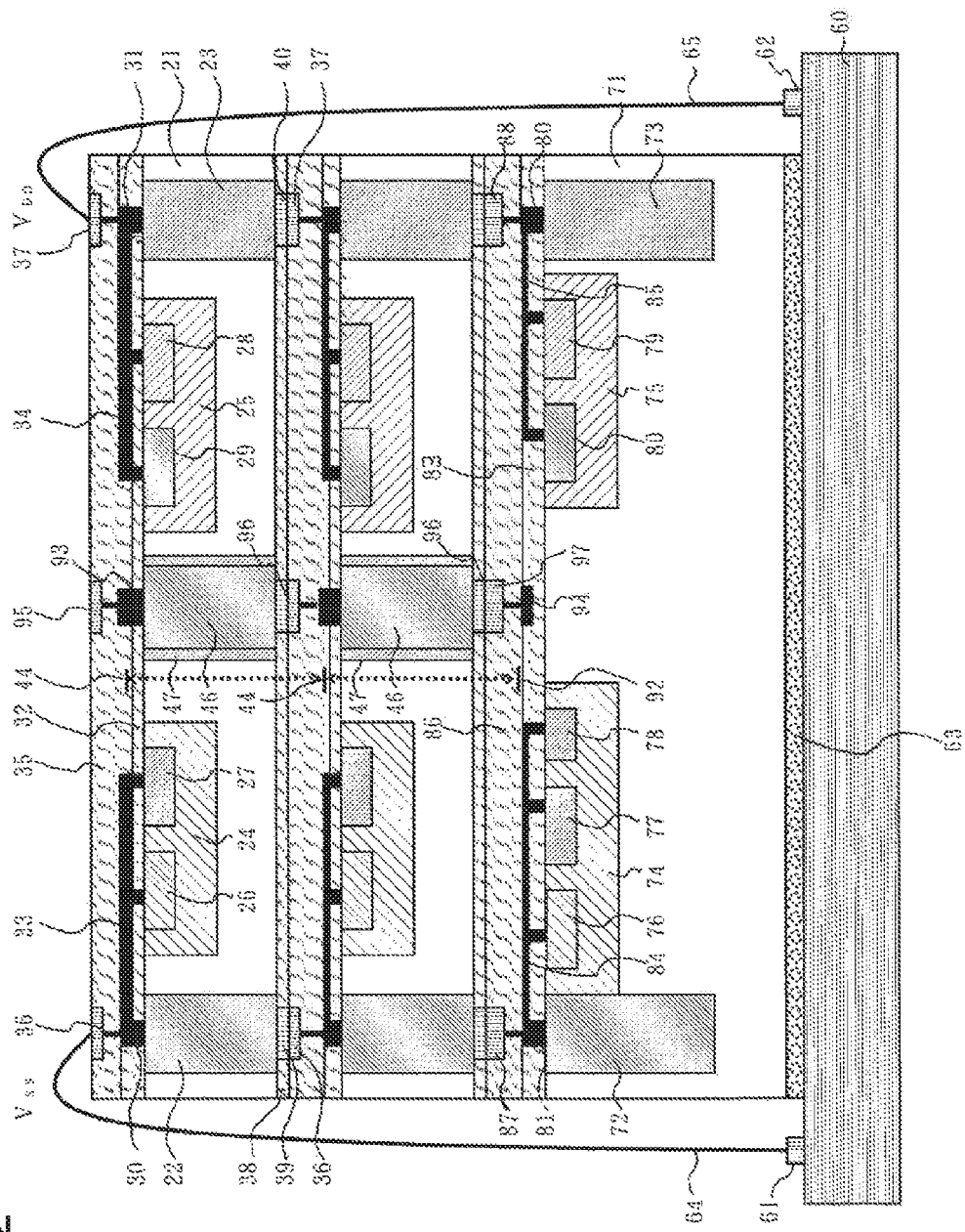
FIG. 32 is a schematic cross-sectional diagram illustrating the multilayer semiconductor integrated circuit device according to Example 13 of the present invention.

Next, in reference to FIG. 32, the multilayer semiconductor integrated circuit device according to Example 13 of the present invention is described. Example 13 is the same as Example 12, except that p$^{++}$ type well regions that are separated by n$^{++}$ separation regions in the same manner as in Example 4 are used as a signal wire for a chip selection signal, and therefore, only the final structure is described. FIG. 31 is a schematic cross-sectional diagram illustrating the multilayer semiconductor integrated circuit device according to Example 12 of the present invention, where p$^{++}$ type well regions 46 that are separated by n$^{++}$ type separation regions 47 are provided in p$^-$ type Si substrates 21 and 71 in the memory chips in the first and second tiers in the same manner as in FIG. 19 as a signal wire for a chip selection signal. A contact electrode 93 and a front surface electrode 95 made of Al or Cu are provided so as to be connected to the p$^{++}$ type well regions 46. In addition, a rear surface electrode 96 made of Al or Cu is provided on the rear surface side so as to be connected to the n$^{++}$ type well regions 45.

A contact electrode 94 and a front surface electrode 97 made of Al or Cu are provided to the controller chip in the third tier so as to be connected to a wire for a chip selection signal (not shown). In this case as well, a coil for inductive coupling data communication 92 is formed of multilayer wires in the same location as that of the coil for communication 44 provided in the memory chip when the chips are layered on top of each other. In addition, polishing is carried out in order to flatten the surface. Here, 83 and 86 in the figure are interlayer insulating films made of SiO$_2$.

Next, the controller chip is fixed onto a package substrate 60 by means of an adhesive 63 through the rear surface of the p$^-$ type Si substrate 71 that forms the controller chip. Next, the power supply pad 61 to which V$_{SS}$ is to be applied and the front surface electrode 36 connected to the p$^{++}$ type well region 22 are connected by means of a bonding wire 64. Meanwhile, the power supply pad 62 to which V$_{DD}$ is to be applied and the front surface electrode 37 connected to the n$^{++}$ type well region 23 are connected by means of a bonding wire 65, and thus, the basic structure of the multilayer semiconductor integrated circuit device according to Example 12 of the present invention is complete.

Though in Example 13 of the present invention the p$^{++}$ type well regions 45 having the same conductivity type as the p$^-$ type Si substrates 21 and 71 are used as a wire for a chip selection signal, which is a low speed signal of 10 MHz or less, the p$^{++}$ type well regions 45 are separated from the p$^-$ type Si substrates 21 and 71 by the n$^{++}$ type separation regions 47, and therefore, no leak current flows vis-à-vis the p$^-$ type Si substrates 21 and 71 when the signal is high.

Though the p$^{++}$ type well regions and the n$^{++}$ type well regions are provided in the same locations in the different chips in the above-described examples, they may be provided in different locations, and in such a case, the front surface electrodes and the rear surface electrodes of the chips layered on top of each other, the rear surface electrodes of the chips layered on top of each other, or the front surface electrodes of the chips layered on top of each other may be provided in the same location. Though the multilayer structure is mounted on a package substrate in the respective examples, it may be mounted on other types of substrates such as a circuit substrate.

The invention claimed is:

1. A multilayer semiconductor integrated circuit device, characterized by being at least provided with:
    a first semiconductor integrated circuit device, comprising:
    a first semiconductor body of which thickness is 10 µm or less;
    a first n type semiconductor region provided in the first semiconductor body, with elements including a transistor being provided in the first n type semiconductor region;
    a first p type semiconductor region provided in the first semiconductor body, with elements including a transistor being provided in the first p type semiconductor region;
    a first penetrating semiconductor region that penetrates through the first semiconductor body in the thickness direction and is connected to a first power supply potential; and
    a second penetrating semiconductor region that penetrates through the first semiconductor body in the thickness direction and is connected to a second power supply potential, and
    a second semiconductor integrated circuit device that forms a multilayer structure with the first semiconductor integrated circuit device, the second semiconductor integrated circuit device comprising: a first electrode electrically connected to the first penetrating semiconductor region; and a second electrode connected to the second penetrating semiconductor region, wherein the resistance value in the first penetrating semiconductor region and the second penetrating semiconductor region is 3 mΩ or less.

2. The multilayer semiconductor integrated circuit device according to claim 1, wherein
    the second semiconductor integrated circuit device comprises:
    a second semiconductor body;
    a second n type semiconductor region provided in the second semiconductor body, with elements including a transistor being provided in the second n type semiconductor region;
    a second p type semiconductor region provided in the second semiconductor body, with elements including a transistor being provided in the second p type semiconductor region;

a third penetrating semiconductor region that penetrates through the second semiconductor body in the thickness direction and is connected to the first power supply potential; and a fourth penetrating semiconductor region that penetrates through the second semiconductor body in the thickness direction and is connected to the second power supply potential, and the first electrode electrically connected to the third penetrating semiconductor region and the second electrode electrically connected to the fourth penetrating semiconductor region are provided in the multilayer semiconductor integrated circuit device.

3. The multilayer semiconductor integrated circuit device according to claim 2, wherein the arrangement of the elements in the first semiconductor integrated circuit device and the arrangement of the elements in the second semiconductor integrated circuit device are the same.

4. The multilayer semiconductor integrated circuit device according to claim 2, wherein the arrangement of the elements in the first semiconductor integrated circuit device and the arrangement of the elements in the second semiconductor integrated circuit device are different.

5. The multilayer semiconductor integrated circuit device according to claim 1, wherein a number of semiconductor integrated circuit devices that are the same as the first semiconductor integrated circuit device and include the first semiconductor integrated circuit device are layered on top of each other.

6. The multilayer semiconductor integrated circuit device according to claim 1, wherein the thickness of the first semiconductor body is 5 μm or less.

7. The multilayer semiconductor integrated circuit device according to claim 1, wherein the first penetrating semiconductor region is of the same conductivity type as the first semiconductor body, and the second penetrating semiconductor region is of the opposite conductivity type to the first semiconductor body.

8. The multilayer semiconductor integrated circuit device according to claim 1, wherein the first penetrating semiconductor region and the second penetrating semiconductor region are of the same conductivity type as the first semiconductor body, and the second penetrating semiconductor region is electrically separated from the first semiconductor body by a layer of the opposite conductivity type.

9. The multilayer semiconductor integrated circuit device according to claim 1, wherein a semiconductor region of the same conductivity types as the first semiconductor body within the first p type semiconductor region or the first n type semiconductor region is electrically separated from the first semiconductor body by a separation layer of the opposite conductivity type, and the separation layer of the opposite conductivity type is exposed from the rear surface of the first semiconductor body.

10. The multilayer semiconductor integrated circuit device according to claim 1, wherein the first semiconductor integrated circuit device and the second semiconductor integrated circuit device have a coil for transmitting and receiving a signal.

* * * * *